United States Patent
Fujimoto et al.

(10) Patent No.: US 7,136,312 B2
(45) Date of Patent: Nov. 14, 2006

(54) SEMICONDUCTOR DEVICE HAVING READ AND WRITE OPERATIONS CORRESPONDING TO READ AND WRITE ROW CONTROL SIGNALS

(75) Inventors: Tomonori Fujimoto, Osaka (JP); Kiyoto Ohta, Osaka (JP); Hirohito Kikukawa, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 208 days.

(21) Appl. No.: 10/918,377

(22) Filed: Aug. 16, 2004

(65) Prior Publication Data

US 2005/0057987 A1 Mar. 17, 2005

(30) Foreign Application Priority Data

Sep. 11, 2003 (JP) ............................. 2003-319629

(51) Int. Cl.
*G11C 7/00* (2006.01)
(52) U.S. Cl. ................ 365/191; 365/203; 365/230.03; 365/233
(58) Field of Classification Search ........... 365/189.01, 365/191, 198, 202, 203, 205, 207, 230.03, 365/233
See application file for complete search history.

(56) References Cited

U.S. PATENT DOCUMENTS

| 5,241,503 | A | | 8/1993 | Cheng | |
|---|---|---|---|---|---|
| 5,253,211 | A | | 10/1993 | Suzuki | |
| 5,274,598 | A | * | 12/1993 | Fujii et al. | 365/205 |
| 5,978,255 | A | * | 11/1999 | Naritake | 365/149 |
| 6,009,024 | A | * | 12/1999 | Hirata et al. | 365/190 |
| 6,507,529 | B1 | * | 1/2003 | Fujimoto et al. | 365/222 |

FOREIGN PATENT DOCUMENTS

JP 5-6659 1/1993

* cited by examiner

*Primary Examiner*—VanThu Nguyen
(74) *Attorney, Agent, or Firm*—McDermott Will & Emery LLP

(57) ABSTRACT

In a semiconductor device that needs a refresh operation for storing data, data of memory cells selected in response to a row address is read to main amplifiers through bit line pairs, sense amplifiers and data line pairs in a page-mode read operation. Thereafter, while outputting the data held in the main amplifiers to the outside, connecting transistors are turned off so as to disconnect the main amplifiers from the memory cells, and thus, the memory cells can be precharged. Also, in a page-mode write operation, while writing externally supplied input data in the main amplifiers, the memory cells can be precharged.

20 Claims, 14 Drawing Sheets

200 ROW CONTROL SIGNAL GENERATION UNIT

US 7,136,312 B2

SEMICONDUCTOR DEVICE HAVING READ AND WRITE OPERATIONS CORRESPONDING TO READ AND WRITE ROW CONTROL SIGNALS

CROSS REFERENCE TO RELATED APPLICATIONS

This Non-provisional application claims priority under 35 U.S.C. § 119(a) on Patent Application No. 2003-319629 filed in Japan on Sep. 11, 2003, the entire contents of which are hereby incorporated by reference.

BACKGROUND OF THE INVENTION

The present invention relates to a semiconductor device equipped with a memory cells that need a refresh operation for storing data.

FIG. 12 shows the architecture of a conventional DRAM. In FIG. 12, a memory cell array 1001 includes a large number of memory cells arranged in a row direction and a column direction; a plurality of pairs of bit lines connected to these memory cells and extending in the column direction; a plurality of sense amplifiers arranged in the row direction for amplifying data on these bit line pairs; and $8n$ pairs of data lines 1001a arranged in the column direction. Also, a 1/8 selection circuit 1002 selects n pairs of data lines 1001a from the $8n$ pairs of data lines. A read amplifier 1003 amplifies data on the n pairs of data lines selected by the 1/8 selection circuit 1002 and outputs the amplified data to the outside. A write amplifier 1004 receives input data from a latch 1005 for latching the input data (writing data) of n bits and amplifies the input data.

The page-mode read operation and the page-mode write operation of such a DRAM will now be described. FIG. 13 is a timing chart for the conventional page-mode read operation and FIG. 14 is a timing chart for the conventional page-mode write operation. First, the conventional page-mode read operation will be described. In FIG. 13, data of memory cells selected in the memory cell may 1001 is amplified by the sense amplifiers to be output to the $8n$ pairs of data lines 1100a through the bit line pairs in a time t1. Out of the data on the $8n$ pairs of data lines 1100a, n pairs of data is selected by the 1/8 selection circuit 1002, and the selected data is amplified by the read amplifier 1003 to be output to the outside. In each of times t2, t3 and t4, data of n bits is output to the outside through the same processing as that performed in the time t1.

Next, the conventional page-mode write operation will be described. In FIG. 14, the input data of n bits latched by the latch 1005 is amplified by the write amplifier 1004, and the amplified data is written, through n pairs of data lines 1100a selected by the 1/8 selection circuit 1002, in memory cells selected in the memory cell array 1100a in a time t1. In each of times t2, t3 and t4, input data is written in selected memory cells through the same processing as that performed in the time t1.

Furthermore, for example, Japanese Laid-Open Patent Publication No. 5-6659 discloses another conventional DRAM in which a plurality of row buffers are provided, each for one row specified by a row address, data of a memory cell array is transferred to a specified buffer out of the plural row buffers in making a normal memory access, data is output from the specified row buffer in a page-mode read operation and data is written in the specified row buffer in a page-mode write operation.

In both of the two types of conventional DRAMs, however, the memory cell array is in an active state during a page-mode cycle, and therefore, a refresh operation for memory cells cannot be performed during this period. Therefore, in the case where a charge holding time of a memory cell is short as in a pure CMOS DRAM, an interval between the refresh operations is long in making a long page access, and hence, it is disadvantageously difficult to hold data.

SUMMARY OF THE INVENTION

An object of the invention is providing a semiconductor device capable of performing a refresh operation for memory cells even during a page-mode cycle.

In order to achieve the object, according to the present invention, in a page-mode read operation, data of memory cells is first read to main amplifiers, and thereafter, while outputting the data of the main amplifiers to the outside, a plurality of main amplifiers and a plurality of memory cells are disconnected from each other so as to perform a precharge operation for these memory cells. Also, in a page-mode write operation, while disconnecting the plural main amplifiers and the plural memory cells from each other, externally supplied input data (writing data) is written in the main amplifiers and the precharge operation for the memory cells is simultaneously performed.

Specifically, the semiconductor device of this invention includes a plurality of memory cells; a plurality of bit line pairs respectively connected to the plurality of memory cells through transistors; a plurality of sense amplifiers respectively connected to the plurality of bit line pairs; a plurality of data line pairs respectively connected to the plurality of sense amplifiers; a plurality of main amplifiers respectively connected to the plurality of data line pairs; a plurality of switching circuits respectively provided between the plurality of sense amplifiers and the plurality of main amplifiers each for connecting/disconnecting a corresponding sense amplifier to/from a corresponding main amplifier; and a memory control circuit, and the memory control circuit controls the plurality of sense amplifiers, the plurality of main amplifiers and the plurality of switching circuits in such a manner as to receive a reading row control signal, a write enable signal, a clock signal, a row address and a column address; write data read from memory cells selected in response to the row address into corresponding main amplifiers through the bit line pairs, the sense amplifiers and the data line pairs in accordance with the clock signal when the reading row control signal is at active level; disconnect the plurality of sense amplifiers from the plurality of main amplifiers by opening the plurality of switching circuits after writing the data read from the memory cells into the main amplifiers, and precharge the plurality of bit line pairs with the data held in the plurality of main amplifiers; and output data held in the main amplifiers selected in response to the column address in accordance with the clock signal when the write enable signal is at non-active level.

Alternatively, the semiconductor device of this invention includes a plurality of memory cells; a plurality of bit line pairs respectively connected to the plurality of memory cells through transistors; a plurality of sense amplifiers respectively connected to the plurality of bit line pairs; a plurality of data line pairs respectively connected to the plurality of sense amplifiers; a plurality of main amplifiers respectively connected to the plurality of data line pairs; a plurality of switching circuits respectively provided between the plurality of sense amplifiers and the plurality of main amplifiers each for connecting/disconnecting a corresponding sense amplifier to/from a corresponding main amplifier; and a memory control circuit, and the memory control circuit performs processing of receiving a reading row control signal, a writing row control signal, a write enable signal, a clock signal, a row address and a column address; writing data read from memory cells selected in response to the row address into corresponding main amplifiers through the bit line pairs, the sense amplifiers and the data line pairs in accordance with the clock signal when the reading row control signal is at active level; when the write enable signal is at active level, writing externally supplied input data into main amplifiers selected in response to the column address, disconnecting the plurality of sense amplifiers from the plurality of main amplifiers by opening the plurality of switching circuits, and precharging the plurality of bit line pairs with the sense amplifiers disconnected from the main amplifiers; and writing data held in the main amplifiers into memory cells selected in response to the row address through the sense amplifiers in accordance with the clock signal when the writing row control signal is at active level.

Alternatively, the semiconductor device of this invention includes a plurality of memory cells; a plurality of bit line pairs respectively connected to the plurality of memory cells through transistors; a plurality of sense amplifiers respectively connected to the plurality of bit line pairs; a plurality of data line pairs respectively connected to the plurality of sense amplifiers; a plurality of main amplifiers respectively connected to the plurality of data line pairs; a plurality of switching circuits respectively provided between the plurality of sense amplifiers and the plurality of main amplifiers each for connecting/disconnecting a corresponding sense amplifier to/from a corresponding main amplifier; and a memory control circuit, and the memory control circuit controls the plurality of sense amplifiers, the plurality of main amplifiers and the plurality of switching circuits in such a manner as to receive a reading row control signal, a write enable signal, a writing row control signal, a clock signal, a row address and a column address; write data read from memory cells selected in response to the row address into corresponding main amplifiers through the bit line pairs, the sense amplifiers and the data line pairs in accordance with the clock signal when the reading row control signal is at active level; disconnect the plurality of sense amplifiers from the plurality of main amplifiers by opening the plurality of switching circuits after writing the data read from the memory cells into the main amplifiers, and precharge the plurality of bit line pairs with the data held in the plurality of main amplifiers; output data held in the main amplifiers selected in response to the column address in accordance with the clock signal when the write enable signal is at non-active level; when the write enable signal is at active level, write externally supplied input data into main amplifiers selected in response to the column address, disconnect the plurality of sense amplifiers from the plurality of main amplifiers by opening the plurality of switching circuits, and precharge the plurality of bit line pairs with the sense amplifiers disconnected from the main amplifiers; and write data held in the main amplifiers into memory cells selected in response to the row address through the plurality of sense amplifiers in accordance with the clock signal when the writing row control signal is at active level.

According to an embodiment, in the semiconductor device of this invention, the memory control circuit receives a column control signal, and outputs, when the write enable signal is at non-active level, data held in main amplifiers selected in response to the column address in accordance with the clock signal when the column control signal is at active level.

According to an embodiment, in the semiconductor device of this invention, the plurality of switching circuits are composed of connecting transistors disposed between the plurality of data line pairs and the plurality of main amplifiers, and the memory control circuit controls the connecting transistors to be turned on for writing data held in the main amplifiers into the memory cells through the sense amplifiers in accordance with the clock signal when the writing row control signal is at active level, and controls the connecting transistors to be turned off in a time other than a time for writing the data.

According to an embodiment, in the semiconductor device of this invention, when the write enable signal is activated subsequently after the reading row control signal is activated, the memory control circuit writes the externally supplied input data into the main amplifiers after writing the data read from the memory cells into the main amplifiers.

According to an embodiment, in the semiconductor device of this invention, the memory control circuit receives a column control signal, and writes, when the write enable signal is at active level, the externally supplied input data into the main amplifiers selected in response to the column address as far as the column control signal is at active level.

According to an embodiment, in the semiconductor device of this invention, the memory control circuit writes the data held in the main amplifiers into the memory cells through the sense amplifiers with amplifying operations of the sense amplifiers halted when the writing row control signal is at active level.

According to an embodiment, in the semiconductor device of this invention, the memory control circuit receives a column control signal, and writes, when the writing row control signal is at active level, the data held in the main amplifiers into the memory cells through the sense amplifiers when the column control signal is at active level.

According to an embodiment, in the semiconductor device of this invention, in a clock cycle following activation of the reading row control signal, the memory control circuit writes data read from the memory cells into the main amplifiers through the data line pairs after precharging the data line pairs.

According to an embodiment, in the semiconductor device of this invention, the memory control circuit receives a column control signal, and writes data read from the memory cells selected in response to the row address into the main amplifies through the sense amplifiers when the column control signal is activated after activation of the reading row control signal.

According to an embodiment, in the semiconductor device of this invention, the switching circuits are composed of connecting transistors disposed between the data line pairs and the main amplifiers, and the memory control circuit controls the connecting transistors to be turned on at start of writing the data read from the memory cells into the main amplifiers when the reading row control signal is at active level, and controls the connecting transistors to be turned off when an amplitude difference between each data line pair attains a level that is able to be sense amplified by a corresponding main amplifier.

According to an embodiment, in the semiconductor device of this invention, the memory control circuit receives a refresh control signal, and starts a refresh operation for the memory cells in accordance with the clock signal when the refresh control signal is at active level and completes the refresh operation within one clock signal cycle.

Alternatively, the semiconductor device of this invention includes a plurality of memory cells; a plurality of bit line pairs respectively connected to the plurality of memory cells through transistors; a plurality of sense amplifiers respectively connected to the plurality of bit line pairs; a plurality of data line pairs respectively connected to the plurality of sense amplifiers; a plurality of main amplifiers respectively connected to the plurality of data line pairs; a plurality of switching circuits respectively provided between the plurality of sense amplifiers and the plurality of main amplifiers each for connecting/disconnecting a corresponding sense amplifier to/from a corresponding main amplifier; and a memory control circuit, and the memory control circuit performs processing of receiving a writing row control signal, a write enable signal, a clock signal, a row address and a column address; when the write enable signal is at active level, writing externally supplied input data into main amplifiers selected in response to the column address, disconnecting the plurality of sense amplifiers from the plurality of main amplifiers by opening the plurality of switching circuits, and precharging the plurality of bit line pairs with the data held in the plurality of main amplifiers; and writing data held in the main amplifiers into memory cells selected in response to the row address through the sense amplifiers in accordance with the clock signal when the writing row control signal is at active level.

Alternatively, the semiconductor device of this invention includes a plurality of memory cells; a plurality of bit line pairs respectively connected to the plurality of memory cells through transistors; a plurality of sense amplifiers respectively connected to the plurality of bit line pairs; a plurality of data line pairs respectively connected to the plurality of sense amplifiers; a plurality of main amplifiers respectively connected to the plurality of data line pairs; a plurality of switching circuits respectively provided between the plurality of sense amplifiers and the plurality of main amplifiers each for connecting/disconnecting a corresponding sense amplifier to/from a corresponding main amplifier; and a memory control circuit, and the memory control circuit performs processing of receiving a reading row control signal, a writing row control signal, a write enable signal, a clock signal, a row address and a column address; writing data read from memory cells selected in response to the row address into corresponding main amplifiers through the bit line pairs, the sense amplifiers and the data line pairs in accordance with the clock signal when the reading row control signal is at active level; disconnecting the plurality of sense amplifiers from the plurality of main amplifiers by opening the plurality of switching circuits after writing the data read from the memory cells into the main amplifiers, and precharging the plurality of bit line pairs each to identical potential with the data held in the plurality of main amplifiers; and writing data held in the main amplifiers in memory cells selected in response to the row address through the sense amplifiers in accordance with the clock signal when the writing row control signal is at active level.

According to an embodiment, the semiconductor device of this invention further includes a first row address latch for receiving the row address and the clock signal and latching the row address in accordance with the clock signal; a second row address latch for latching an output of the first row address latch at timing delayed from the clock signal by a given time; and a row control circuit, and the row control circuit receives the clock signal and a row control signal, and outputs a row activation signal with a delay of a given time from a latch signal of the second row address latch when the row control signal is at active level at a rise or fall of the clock signal.

According to an embodiment, in the semiconductor device of this invention, the row control circuit receives a refresh control signal and outputs the row activation signal with a delay of a given time from a rise or fall of the clock signal when the refresh control signal is at active level at a rise or fall of the clock signal, and the given time for the delay is set to a time exceeding a delay time from the latch signal of the second row address latch to output of the row activation signal.

According to an embodiment, in the semiconductor device of this invention, the memory control circuit writes the externally supplied input data directly into memory cells selected in response to the row address and the column address when the reading row control signal and the writing row control signal are both at active level at a rise or fall of the clock signal.

According to an embodiment, in the semiconductor device of this invention, the memory control circuit halts amplifying operations of the main amplifiers when the externally supplied input data is directly written in the memory cells.

According to an embodiment, in the semiconductor device of this invention, the memory control circuit writes the data held in the main amplifiers through the bit line pairs immediately after a rise or fall of the clock signal when the writing row control signal is at active level at a rise or fall of the clock signal.

Therefore, according to the semiconductor device of the present invention, since data is read from the main amplifiers in a page-mode read operation, the plurality of memory cells can be precharged with the plurality of main amplifiers and the plurality of memory cells disconnected from each other by opening the switching circuits, and hence, the operation for refreshing data of the memory cells can be performed during the page-mode read operation. Also, since externally supplied input data is written in the main amplifiers in a page-mode write operation, the memory cells can be precharged when the plurality of main amplifiers are disconnected from the plurality of memory cells, and hence, the operation for refreshing data of the memory cells can be performed during the page-mode write operation.

In particular, according to an embodiment, when externally supplied input data is written in the main amplifiers in a page-mode write operation, the connecting transistors disposed between the data line pairs and the main amplifiers are controlled to be turned off. Therefore, the load capacitance of the main amplifiers can be reduced correspondingly to the capacitance of the data line pairs, resulting in increasing the speed of the page-mode write operation.

Furthermore, according to an embodiment, when data held in the main amplifiers is written in the memory cells, the sense amplifiers are placed in a halt state. Therefore, collision between data of the sense amplifiers and the data of the main amplifiers can be avoided, resulting in increasing the operation speed for writing the data in the main amplifiers.

Moreover, according to an embodiment, when data of the memory cells is written in the main amplifiers, a precharge operation of the data line pairs and the operation for writing the data of the memory cells in the main amplifiers through these data line pairs are performed in one cycle of the clock signal. Therefore, the data can be held in the main amplifiers in cycles other than this cycle, and hence, a read/write operation of the main amplifiers can be always performed.

In addition, according to an embodiment, in the case where data of the memory cells is written in the main amplifiers through the data line pairs, the connecting transistors are controlled to be turned off when an amplitude difference between the data line pair is increased to a level that can be amplified by the main amplifier, so as to disconnect the data line pair from the main amplifier. Therefore, the load capacitance of the main amplifiers can be reduced correspondingly to the capacitance of the data line pairs, resulting in reducing power consumption.

Furthermore, according to an embodiment, since a refresh operation for data of the memory cells can be completed in one cycle of the clock signal, one refresh operation can be simultaneously performed during a page-mode cycle of one clock signal.

Moreover, according to an embodiment, after writing externally supplied input data in main amplifiers selected in response to a column address, the input data of these main amplifiers can be written in memory cells selected in response to a row address. Therefore, in repeatedly writing specific data in a given region of a memory cell array, data can be written in memory cells by regarding, as a unit, a group of main amplifiers selected in response to the column address, and time necessary for this write operation can be shortened.

In addition, according to an embodiment, after writing data of a plurality of memory cells selected in response to a row address in the main amplifiers through the sense amplifiers, the data of these main amplifiers is written in a plurality of memory cells selected in response to another row address. Therefore, data copying operation between memory cells in respective rows can be performed in a short time.

Furthermore, according to an embodiment, when the reading row control signal and the writing row control signal are both at active level at a rise or fall of the clock signal, externally supplied input data is directly written in memory cells selected in response to a row address and a column address. Therefore, a general operation of a DRAM can be performed. In this case, when the amplifying operations of the main amplifiers are halted as in this invention, data of main amplifiers not selected in response to the column address can be prevented from being written in memory cells.

DETAILED DESCRIPTION OF THE INVENTION

A DRAM (semiconductor device) according to a preferred embodiment of the invention will now be described with reference to the accompanying drawings.

Figure 1:
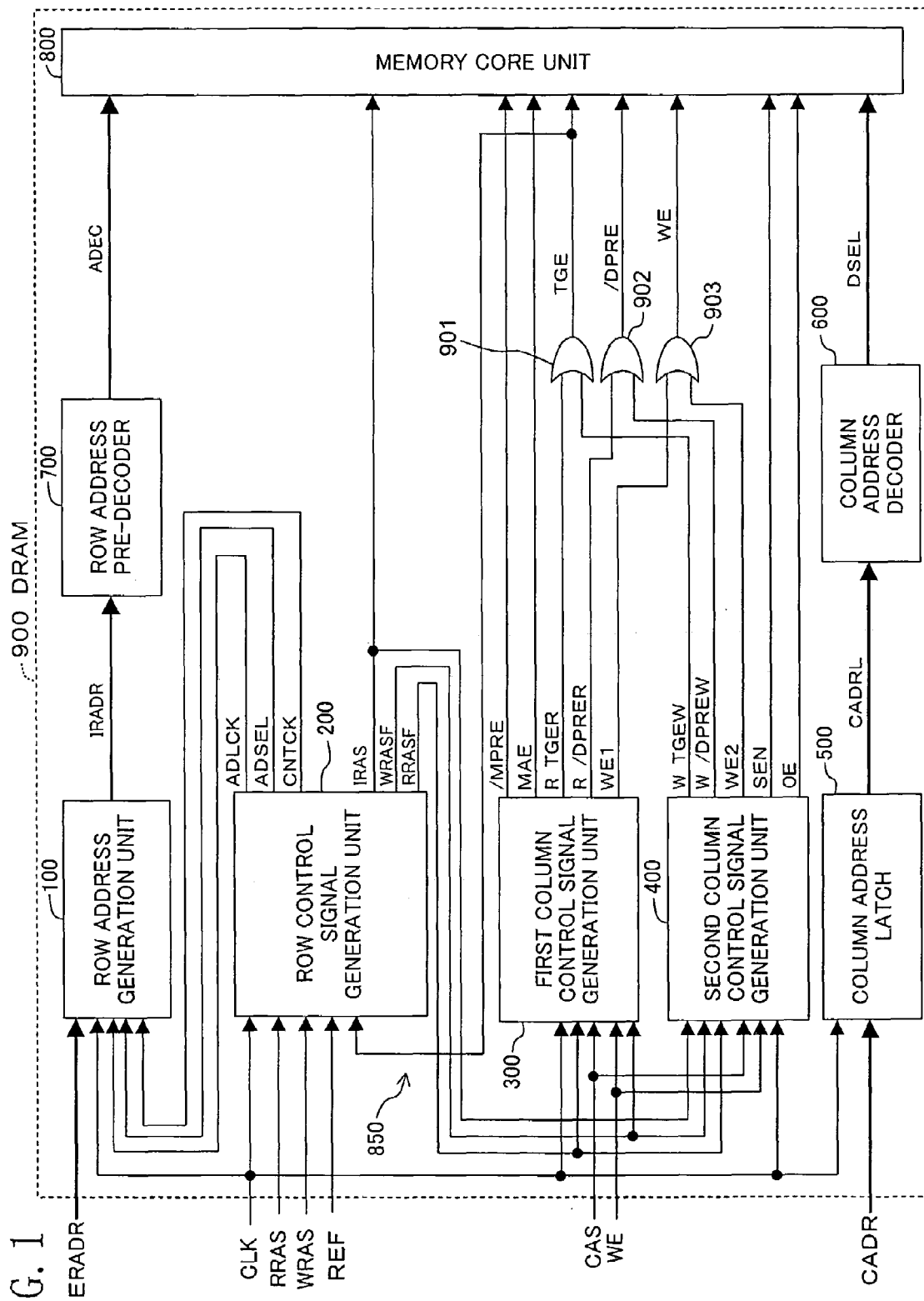
FIG. 1 is a block diagram of a semiconductor device according to an embodiment of the invention.

FIG. 1 shows the architecture of the DRAM 900. In FIG. 1, the DRAM 900 includes a row address generation unit 100, a row control signal generation unit 200, a first column control signal generation unit 300, a second column control signal generation unit 400, a column address latch 500, a column address decoder 600, a row address pre-decoder 700 and a memory core unit 800.

The row address generation unit 100 receives, as shown also in FIG. 4, an external row address ERADR, a clock CLK, an address latch clock ADLCK described below and supplied from the row control signal generation unit 200, an address switching signal ADSEL and a count clock CNTCK, and generates and outputs an internal row address IRADR. Also, the row control signal generation unit 200 receives, as shown also in FIG. 3, the clock CLK, a reading row control signal RRAS, a writing row control signal WRAS, a refresh control signal REF and a transfer gate enable signal TGE described below and supplied from an OR circuit 901, and generates and outputs the address latch clock ADLCK, the address switching signal ADSEL, the count clock CNTCK, an internal row control signal IRAS, a writing row control signal flag WRASF and a reading row control signal flag RRASF.

Figure 5:
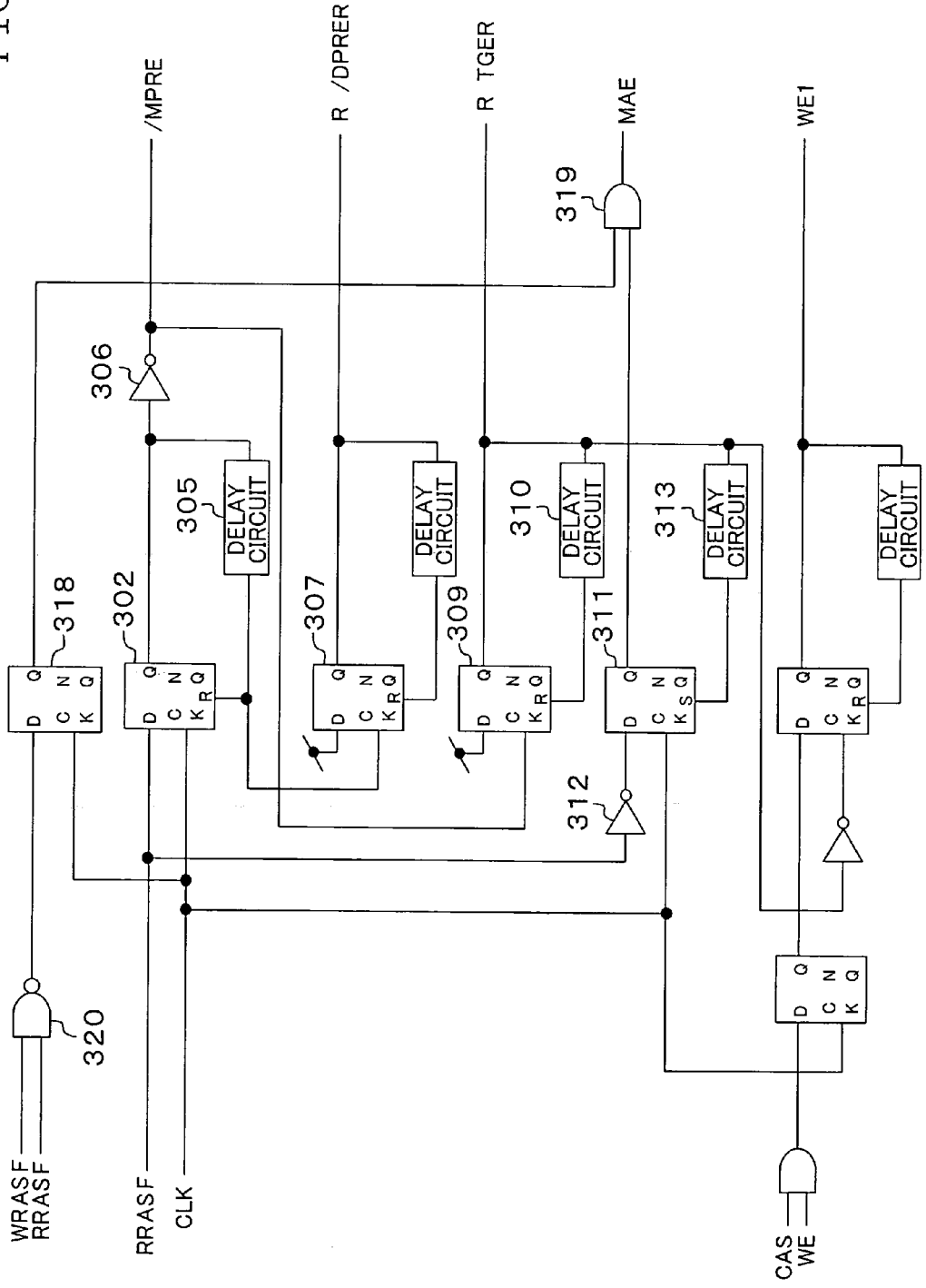
FIG. 5 is an internal circuit diagram of a first column control signal generation unit included in the semiconductor device.

Furthermore, the first column control signal generation unit 300 receives, as shown also in FIG. 5, the clock CLK, a column control signal CAS, a write enable signal WE and the reading and writing row control signal flags RRASF and WRASF supplied from the row control signal generation unit 200, and generates and outputs a /main amplifier precharge signal /MPRE, a main amplifier enable signal MAE, a transfer gate enable signal R TGER, a /data line precharge signal R /DPRER and a first write enable signal WE1. The second column control signal generation unit 400 receives, as shown also in FIG. 6, the clock CLK, the column control signal CAS, the write enable signal WE, and the internal row control signal IRAS and the reading and writing row control signal flags RRASF and WRASF supplied from the row control signal generation unit 200, and generates and outputs a transfer gate enable signal W TGEW, a /data precharge signal W /DPREW, a second write enable signal WE2, a sense amplifier enable signal SEN and an output enable signal OW.

In addition, the column address latch 500 receives an external column address CADR and generates and outputs an external column address latch signal CADRL. The column address decoder 600 receives the external column address latch signal CADRL supplied from the column address latch 500 and generates and outputs a data selection signal (7:0) DSEL. The OR circuit 901 receives the transfer gate enable signal R TGER and the transfer gate enable signal W TGEW respectively supplied from the first and second column control signal generation units 300 and 400, and outputs the transfer gate enable signal TGE. Furthermore, an OR circuit 902 receives the /data line precharge signal R /DPRER and the /data line precharge signal W DPREW respectively supplied from the first and second column control signal generation units 300 and 400, and outputs a /data line precharge signal /DPRE. Moreover, an OR circuit 903 receives the first and second write enable signals WE1 and WE2 respectively supplied from the first and second column control signal generation units 300 and 400 and outputs a write enable signal WE.

Figure 2:
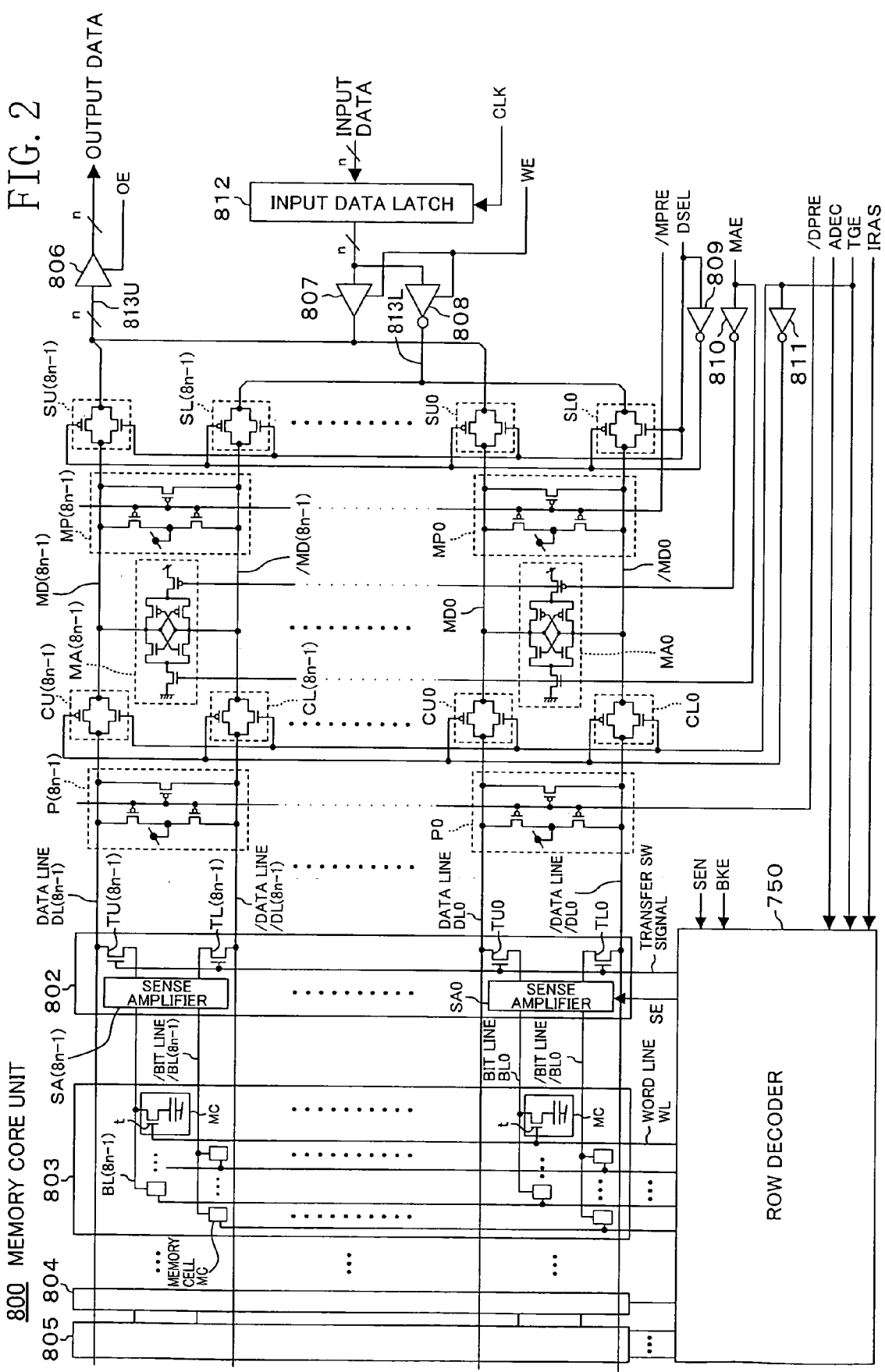
FIG. 2 is a specific circuit diagram of a memory core unit included in the semiconductor device.

Also, the memory core unit 800 has an internal architecture shown in FIG. 2. Now, the architecture shown in FIG. 2 will be described. The memory core unit 800 of FIG. 2 includes a plurality of memory cell blocks 803, 805, etc. and sense amplifier blocks 802, 804, etc. respectively disposed on the right hand side of the memory cell blocks 803, 805, etc. Each of the memory cell blocks 803, 805, etc. has $8n$ (wherein n is an integer of 1 or more) bit lines pairs (BL0, /BL0) through (BL($8n$-1), /BL($8n$-1)) arranged in a column direction, each of these bit line pairs is connected to a large number of memory cells MC, and these memory cells are selected by using a large number of word lines WL arranged in a row direction. On the other hand, each of the sense amplifier blocks 802, 804, etc. has $8n$ sense amplifiers SA0 through SA($8n$-1), and these sense amplifiers are respectively connected to corresponding bit line pairs and are respectively connected to $8n$ data line pairs (DL0, /DL0) through (DL($8n$-1), /DL($8n$-1)) arranged in the column direction through $8n$ pairs of connecting transistors (TU0, TL0) through (TU($8n$-1), TL($8n$-1)).

The $8n$ data line pairs are respectively connected to $8n$ data line precharge circuits P0 through P($8n$-1), and $8n$ connecting transistor pairs (CU0, CL0) through (CU($8n$-1), CL($8n$-1)) are disposed on the right hand side in the drawing of the data line pairs. Furthermore, the $8n$ connecting transistor pairs are respectively connected to $8n$ main amplifier data line pairs (MD0, /MD0) through (MD($8n$-1), /MD($8n$-1)), these main amplifier data line pairs are respectively connected to $8n$ main amplifiers MA0 through MA($8n$-1), and $8n$ main amplifier precharge circuits MP0 through MP($8n$-1) are respectively connected on the further right hand side in the drawing. Each of the $8n$ connecting transistor pairs (CU0, CL0) through (CU($8n$-1), CL($8n$-1)) functions as a switching circuit for connecting/disconnecting a sense amplifier SA to/from a corresponding main amplifier MA. When a connecting transistor pair is opened, the corresponding data line pair following the data line precharge circuits P is disconnected, and hence, the load capacitance of the corresponding main amplifier MA is reduced. In the case where the $8n$ connecting transistor pairs (CU0, CL0) through (CU($8n$-1), CL($8n$-1)) are not provided, the connecting transistor pairs (TU0, TL0) through (TU($8n$-1), TL($8n$-1)) disposed in the vicinity of the sense amplifiers SA function as the switching circuits.

The ends on the right hand side in the drawing of the main amplifier data line pairs MD are connected to $8n$ selection switch pairs (SU0, SL0) through (SU($8n$-1), SL($8n$-1)), and $8n$ selection switches SU0 through SU($8n$-1) out of these $8n$ selection switch pairs are connected to n signal lines 813U. An output buffer 806 is provided to the signal lines 813U, so that the output buffer 806 can receive the output enable signal OE from the second column control signal generation unit 400 for controlling data output from the n signal lines 813U. Also, the other $8n$ selection switches SL0 through SL($8n$-1) are connected to n signal lines 813L, and the signal lines 813U and the signal lines 813L are connected to an input data latch 812 through input buffers 807 and 808. The input data latch 812 receives externally supplied input data (writing data), and the input data is transferred to the $8n$ pairs of selection switches through the input buffers 807 and 808. The input data latch 812 is controlled in accordance with the clock CLK, and the input buffers 807 and 808 are controlled in accordance with the write enable signal WE supplied from the OR circuit 903 shown in FIG. 1.

The $8n$ selection switch pairs (SU0, SL0) through (SU($8n$-1), SL($8n$-1)) are controlled in accordance with the data selection signal (7:0) DSEL supplied from the column address decoder 600 shown in FIG. 1. The $8n$ main amplifier precharge circuits MP are controlled in accordance with the /main amplifier precharge signal /MPRE supplied from the first column control signal generation unit 300, and the $8n$ main amplifiers MA are controlled in accordance with the main amplifier enable signal MAE supplied from the first column control signal generation unit 300. Furthermore, the $8n$ pairs of connecting transistors CU and CL are controlled in accordance with the transfer gate enable signal TGE supplied from the OR circuit 901, and the $8n$ data line precharge circuits P are controlled in accordance with the /data line precharge signal /DPRE supplied from the OR circuit 902. A row decoder 750 shown in FIG. 2 receives the /data line precharge signal /DPRE supplied from the OR circuit 902, the row pre-decode signal ADEC supplied from the row address pre-decoder 700, the transfer gate enable signal TGE supplied from the OR circuit 901 respectively shown in FIG. 1 and a block selection signal BKE, and when the block selection signal BKE corresponds to its own block, the row decoder 750 selects and activates a corresponding word line WL, outputs a sense amplifier enable signal SE to a corresponding sense amplifier SA, and activates a corresponding transfer SW signal so as to turn on a corresponding connecting pair of the transistors (TU0, TL0) through (TU($8n$-1), TL($8n$-1)).

The row address generation unit 100, the row control signal generation unit 200, the first column control signal generation unit 300, the second column control signal generation unit 400, the column address latch 500, the column address decoder 600, the row address pre-decoder 700, the three OR circuits 901 through 903 shown in FIG. 1 and the row decoder 750 shown in FIG. 2 together construct a memory control circuit 850.

Although not shown in the drawings, the sense amplifier block 802 includes, in the vicinity of respective sense amplifiers SA, $8n$ precharge circuits each for precharging each pair of the bit line pairs (BL0, /BL0) through (BL($8n$-1), /BL($8n$-1)) to given identical potential, and each of the precharge circuits is controlled in accordance with a bit line precharge control signal supplied from the row decoder 750.

Now, a page-mode access operation and a refresh operation performed during the page-mode access operation of the DRAM 900 will be described with reference to the circuit architecture shown in FIGS. 1 through 6.

Figure 7:
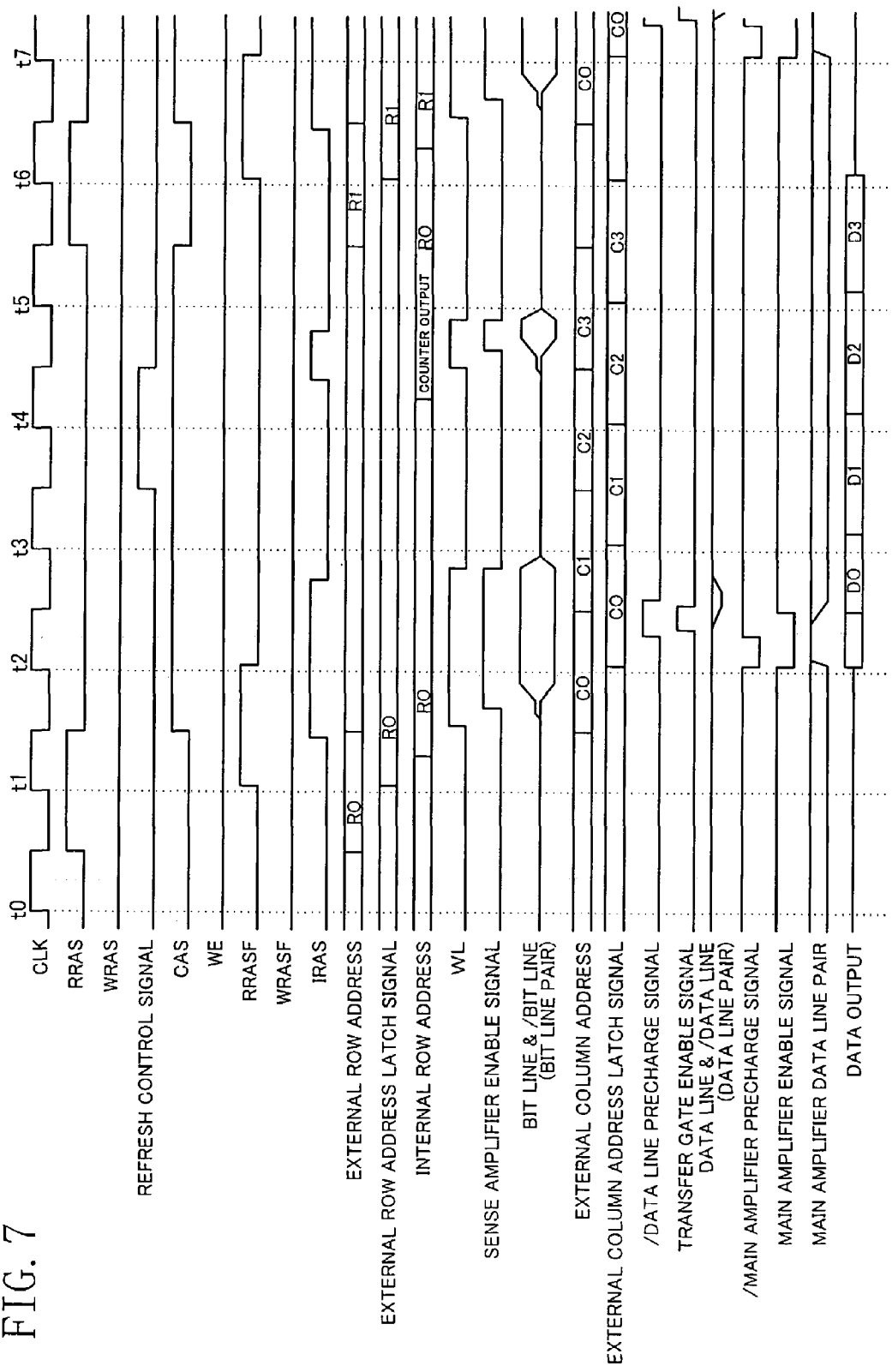
FIG. 7 is a timing chart for a page-mode read operation of the semiconductor device.

First, a page-mode read operation and a refresh operation will be described. FIG. 7 is a timing chart for the whole page-mode read operation (in which data is read four times).

In FIG. 7, when the reading row control signal RRAS undergoes a H transition at a rise of the clock signal in a time t1, the reading row control signal flag RRASF corresponding to the output of a D flip-flop (hereinafter referred to as the DFF) 201 of the row control signal generation unit 200 of FIG. 3 undergoes a H transition, and therefore, the internal row control signal (row activation/halt signal) IRAS is activated through an AND circuit 213 and an OR circuit 218. As a result, a row system operation is started.

When the internal row control signal IRAS undergoes a H transition, the row decoder 750 of FIG. 2 selects and turns on a given word line WL in a given memory cell block (for example, the memory cell block 803) in response to an external row address on the basis of the row pre-decode signal supplied from-the row address pre-decoder 700. As a result, data of memory cells MC connected through transistors t to this word line WL thus placed in an ON state is output to the bit lines BL and /BL. On the other hand, in the second column control signal generation unit 400 of FIG. 6, the sense amplifier enable signal is activated through AND circuits 417 and 419 so as to enable a corresponding sense amplifier SA, and therefore, the data output to the bit lines BL and /BL is amplified.

At a rise of the clock signal in a time t2, the /main amplifier precharge signal is deactivated through a DFF 302 and an inverter 306 of the first column control signal generation unit 300 of FIG. 5, and therefore, the main amplifier data line pair MD is precharged. At the same time, the main amplifier enable signal is deactivated through an inverter 312, a DFF 311 and an AND circuit 319, so as to halt the operations of the main amplifiers MA0 through MA(8n-1). Thereafter, when a delay time of a delay circuit 305 elapses, the /data line precharge signal R is activated through a DFF 307 and the /data line precharge signal is activated through the OR circuit 902 of FIG. 1, so as to reset the precharge of the pair of data lines DL and /DL. Furthermore, the transfer gate enable signal R is activated through a DFF 309 of FIG. 5 and the transfer gate enable signal is activated through the OR circuit 901 of FIG. 1, so as to turn on the connecting transistors TU and TL. In addition, the transfer SW signal is activated by the row decoder 750 of FIG. 2, so as to turn on the connecting transistors CU and CL, and thus, the data read to the bit lines BL and /BL is output to the main amplifier data line pair MD. Thereafter, when a delay time of a delay circuit 313 elapses, the main amplifier MA is enabled by activating the main amplifier enable signal through the DFF 311 and the AND circuit 319, so that the data output to the main amplifier data line pair MD can be amplified and held. Thus, the data of the memory cells MC is written in the main amplifiers MA. At this point, the connecting transistors TU, TL, CU and CL are controlled to be turned off by deactivating the transfer gate enable signal through the DFF 309 when an amplitude difference between the data lines DL and /DL becomes a difference that can be sense amplified by the main amplifier MA, namely, when a delay time of a delay circuit 310 of FIG. 5 elapses. In this manner, the data line pair DL and /DL are disconnected from the main amplifier MA at the time of the data amplifying operation of the main amplifier MA, and therefore, the load capacitance of the main amplifier MA is reduced so as to reduce power consumption.

Figure 3:
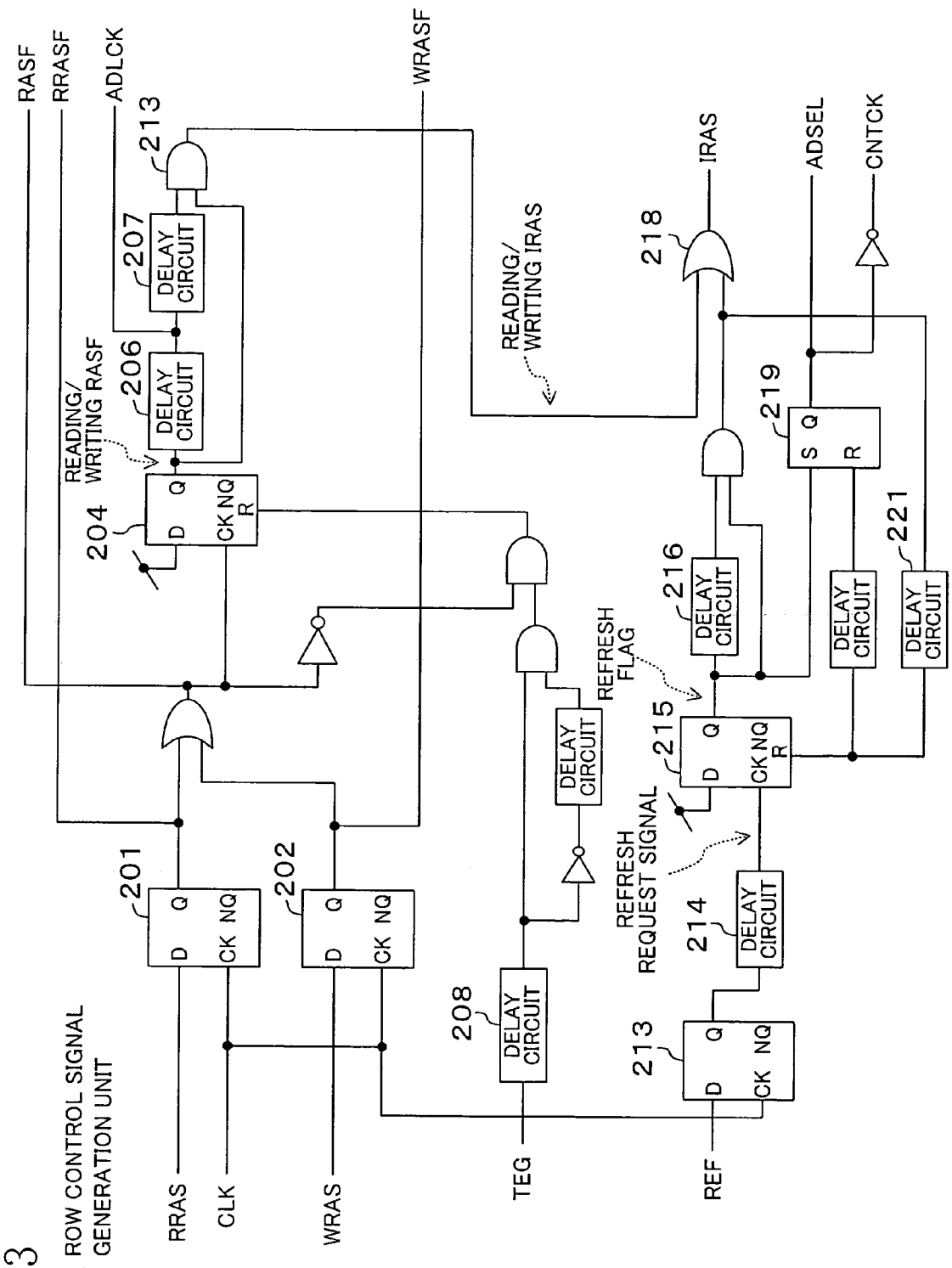
FIG. 3 is an internal circuit diagram of a row control signal generation unit included in the semiconductor device.

Furthermore, after the connecting transistors TU, TL, CU and CL are turned off, when a delay time of a delay circuit 208 of the row control signal generation unit 200 of FIG. 3 elapses, the internal row control signal IRAS is deactivated by resetting a DFF 204, and the word line WL is turned off by the row decoder 750. In addition, the operation of the sense amplifier SA is halted, so as to precharge the bit lines BL and /BL to given potential. Thus, the row system operation is stopped. Since the column control signal CAS is at H level and the write enable signal WE is at L level at the rise of the clock signal in the time t2, the output enable signal is activated through an inverter 412, an AND circuit 411 and a DFF 418 of the second column control signal generation unit 400 of FIG. 6, so as to turn on the output buffer 806. At this point, among the selection switches SU0 through SU(8n-1), n selection switches corresponding to an external column address C0 are selected in accordance with the data selection signal (7:0) supplied by the column address decoder 600 of FIG. 1, and therefore, data D0 of n bits held in the main amplifiers MA is output through the selected selection switches SU and the output buffer 806 to the outside.

In a time t3, since the column control signal CAS is at H level and the write enable signal WE is at L level at a rise of the clock signal, the output enable signal is activated in the same manner as described above. Therefore, out of 8n data held in the main amplifiers MA, data D1 of n bits selected in response to an external column address C1 is output to the outside through the n selection switches SU placed in an ON state.

Subsequently, in a time t4, since the refresh control signal is at H level at a rise of the clock signal, the output of the DFF 213 of the row control signal generation unit 200 of FIG. 3 undergoes a H transition, and hence, when a total delay time of delay circuits 214 and 216 elapses after the time t4, the internal row control signal IRAS undergoes a H transition. Thus, the row decoder 750 turns on a word line WL selected in response to an output address of a refresh counter 103 of the row address generation unit 100 of FIG. 4, and data of the memory cells MC connected to this word line WL through the transistors t is output to the bit lines BL and /BL. Also, the sense amplifier enable signal is activated thuough the AND circuits 417 and 419 of the second column control signal generation unit 400 so as to enable the sense amplifiers SA, the data output to the bit lines BL and /BL is amplified, and the amplified data is written again in the selected memory cells MC. Thereafter, when a delay time of a delay circuit 221 of the row control signal generation unit 200 of FIG. 3 elapses, the internal row control signal IRAS is deactivated through a DFF 215, and the word line WL is turned off by the row decoder 750 so as to halt the operation of the sense amplifiers SA, and the bit lines BL and /BL are precharged to given identical potential. Thus, the refresh operation is stopped.

In the time t4, since the column control signal CAS is at H level and the write enable signal WE is at L level at the rise of the clock signal, the output enable signal is activated in the same manner as described above. Therefore, out of 8n data held in the main amplifiers MA, data D2 of n bits selected in response to an external column address C2 is output to the outside through the n selection switches SU placed in an ON state.

In this manner, the read operation and the refresh operation are simultaneously performed in the time t4.

In a next time t5, in the same manner as in the time t3, data D3 of n bits selected from the 8n data held in the main amplifiers MA in response to an external column address C3 is output to the outside through the n selection switches SU placed in an ON state.

Figure 6:
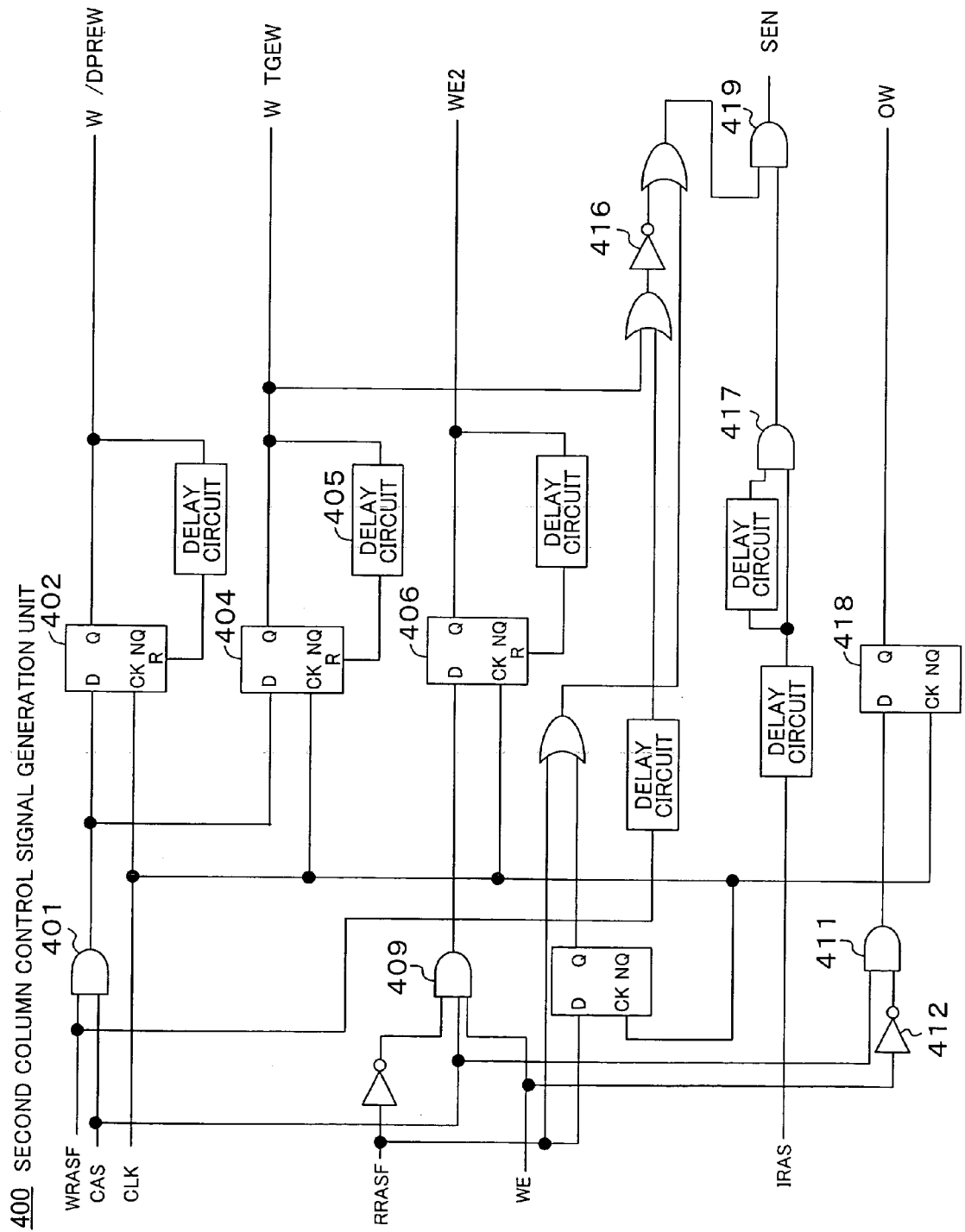
FIG. 6 is an internal circuit diagram of a second column control signal generation unit included in the semiconductor device.

In a time t6, since the column control signal CAS is at L level at a rise of the clock signal, the output enable signal is deactivated through the AND circuit 411 and the DFF 418 of the column control signal generation unit 400 of FIG. 6, so as to place the data output in a Hi-z (high impedance) state.

Figure 9:
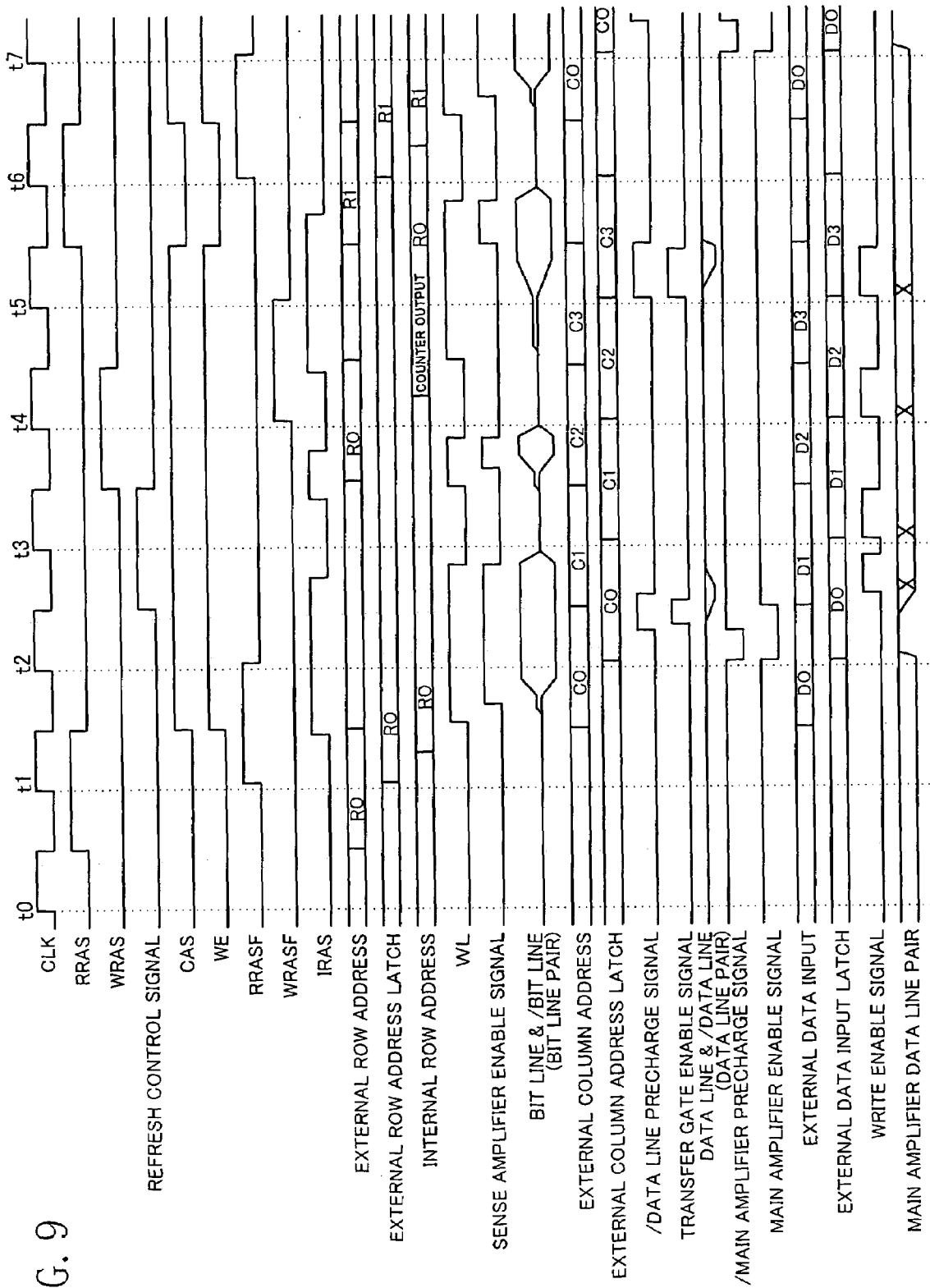
FIG. 9 is a timing chart for a page-mode write operation of the semiconductor device.

Next, a page-mode write operation and a refresh operation will be described. FIG. 9 is a timing chart for this page-mode write operation (in which data is written four times).

In FIG. 9, when the writing row control signal WRAS undergoes a H transition at a rise of the clock signal, the internal row control signal IRAS undergoes a H transition to start the row system operation in the same manner as in the time t1 and the time t2 of FIG. 7. Thus, data of the memory cells MC selected in response to a row address R0 is written in the main amplifiers MA.

In a time t2, since the column control signal CAS is at H level and the write enable signal WE is at H level at a rise of the clock signal, the transfer gate enable signal R of the first column control signal generation unit 300 of FIG. 5 undergoes a L transition, so as to turn off the connecting transistors TU, TL, CU and CL. Thereafter, the second write enable signal is activated through an AND circuit 409 and a DFF 406 of the second column control signal generation unit 400 of FIG. 6, and the write enable signal is activated through the OR circuit 903 of FIG. 1, so as to turn on the input buffers 807 and 808. As a result, input data D0 is written in the corresponding n main amplifiers MA through n selection switches SU selected in response to the data selection signal (7:0) supplied from the column address decoder 600 of FIG. 1.

In a time t3, since the refresh control signal is at H level at a rise of the clock signal, the output of a DFF 213 of the row control signal generation unit 200 of FIG. 3 undergoes a H transition, and hence, when a given time corresponding to the total delay time of the delay circuits 214 and 216 elapses from the time t3, the internal row control signal IRAS undergoes a H transition. Thus, in the row address generation unit 100 of FIG. 4, an output address of the refresh counter 103 is output as an internal address, the row decoder 750 turns on the word line WL selected in response to the internal address, and data of the memory cells MC connected to the word line WL through the transistors t is output to the bit lines BL and /BL. Also, the sense amplifier enable signal is activated through the AND circuits 417 and 419 of the column control signal generation unit 400 of FIG. 6 so as to enable the sense amplifiers SA. Thus, the data on the bit lines BL and /BL is amplified and the amplified data is written in the selected memory cells MC again. Thereafter, when a delay time of the delay circuit 221 of FIG. 3 elapses, the internal row control signal IRAS undergoes a L transition, and hence, the row decoder 750 turns off the word line WL, so as to halt the operation of the sense amplifiers SA, and the bit lines BL and /BL are precharged to identical potential. Thus, the refresh operation is stopped.

In the time t3, since the column control signal CAS is at H level and the write enable signal WE is at H level at the rise of the clock signal, the second write enable signal is activated through the AND circuit 409 and the DFF 406 of the second column control signal generation unit 400 of FIG. 6 at the same time as the rise of the clock signal. The write enable signal is activated through the OR circuit 903 of FIG. 1, so as to transfer input data D1 latched by the input data latch 812 through the input buffers 807 and 808 to the 8n selection switches SU. The input data D1 of n bits is written in the corresponding n main amplifiers MA merely through n selection switches SU selected, out of the 8n selection switches SU, in response to an external column address C1 in accordance with the data selection signal (7:0) supplied from the column address decoder 600 of FIG. 1.

In this manner, the write operation and the refresh operation are simultaneously performed in the time t3.

In a next time t4, since the column control signal CAS is at H level and the write enable signal WE is at H level at a rise of the clock signal, input data D2 of n bits is written in the selected n main amplifies MA in the same manner as in the time t3.

Also, in the time t4, when the writing row control signal WRAS undergoes a H transition at the rise of the clock signal, the output of a DFF 202 of the row control signal generation unit 200 of FIG. 3, namely, the writing row control signal flag WRASF, undergoes a H transition and the internal row control signal (row activation/halt signal) IRAS undergoes a H transition, and hence, the row system operation is started. Thus, the row decoder 750 turns on the word line WL selected in response to an external row address R0. At this point, in the case where the writing row control signal flag WRASF is at H level, even when the word line WL is turned ON, the sense amplifiers SA are kept in a halt state by keeping the sense amplifier enable signal at L level by an inverter 416 and the AND circuit 419 of the column control signal generation unit 400 of FIG. 6. Thus, in a write operation for overwriting input data on data of the memory cells MC, collision between the outputs of the main amplifiers MA and the outputs of the sense amplifiers SA can be avoided so as not to take a long time to write the input data.

In a next time t5, since the writing row control signal flag WRASF is at H level and the column control signal CAS is at H level at a rise of the clock signal, the /data line precharge signal W is activated through an AND circuit 401 and a DFF 402 of the second column control signal generation unit 400 of FIG. 6 and the data line precharge signal supplied from the OR circuit 902 of FIG. 1 is activated, so as to reset the precharge of the data lines DL and /DL. Also, the transfer gate enable signal W is activated through a DFD 404 and the transfer gate enable signal supplied from the OR circuit 901 of FIG. 1 is activated, so as to turn on the connecting transistors TU, TL, CU and CL. Thus, data of the 8n main amplifiers MA is started to be written in the memory cells MC selected by the word line WL through the data line pair DL and /DL and the bit line pair BL and /BL. When a delay time of a delay circuit 405 of the second column control signal generation unit 400 of FIG. 6 elapses, the transfer gate enable signal W undergoes a L transition, so as to control to turn off the connecting transistors TU, TL, CU and CL. When the transfer gate enable signal undergoes a L transition, the sense amplifier enable signal is activated by the AND circuit 419, so as to continue to write data in the memory cells MC by the sense amplifiers SA. When a delay time of the delay circuit 208 of the row control signal generation unit 200 of FIG. 3 elapses after the L transition of the transfer gate enable signal, the DFF 204 is reset so as to deactivate the internal row control signal IRAS. Thus, the row decoder 750 turns off the word line WL, the operations of the sense amplifiers SA are halted, and the bit lines BL and /BL are precharged to given potential. Thus, the row system operation is stopped.

At the same time, in the time t5, since the write enable signal WE is at H level at the rise of the clock signal, the second write enable signal is activated through the DFF 406 of the second column control signal generation unit 400 of FIG. 6 immediately after the rise of the clock signal, and the write enable signal supplied from the OR circuit 903 of FIG. 1 undergoes a H transition. Therefore, externally supplied input data D3 latched in accordance with the clock signal is started to be written in the selected main amplifies MA and memory cells MC slightly after the write operation of the data of the main amplifiers MA in the memory cells MC.

In the timing chart of FIG. 9, in the case where the writing row control signal flag WRAS is at H level in the time t4 and the column control signal CAS is at H level in the time t5, the data of the main amplifiers MA is written in the selected memory cells MC in the time t5. However, if there is no need to control a write operation by using the column control signal CAS, a write mode is defined when the writing row control signal flag WRASF undergoes a H transition in the time t4. Therefore, in this case, the data of the main amplifiers MA is written in the selected memory cells MC immediately after defining the write mode, and thus, data write can be rapidly performed.

Next, row control timing during the page-mode read operation will be described on the basis of FIG. 8.

Figure 4:
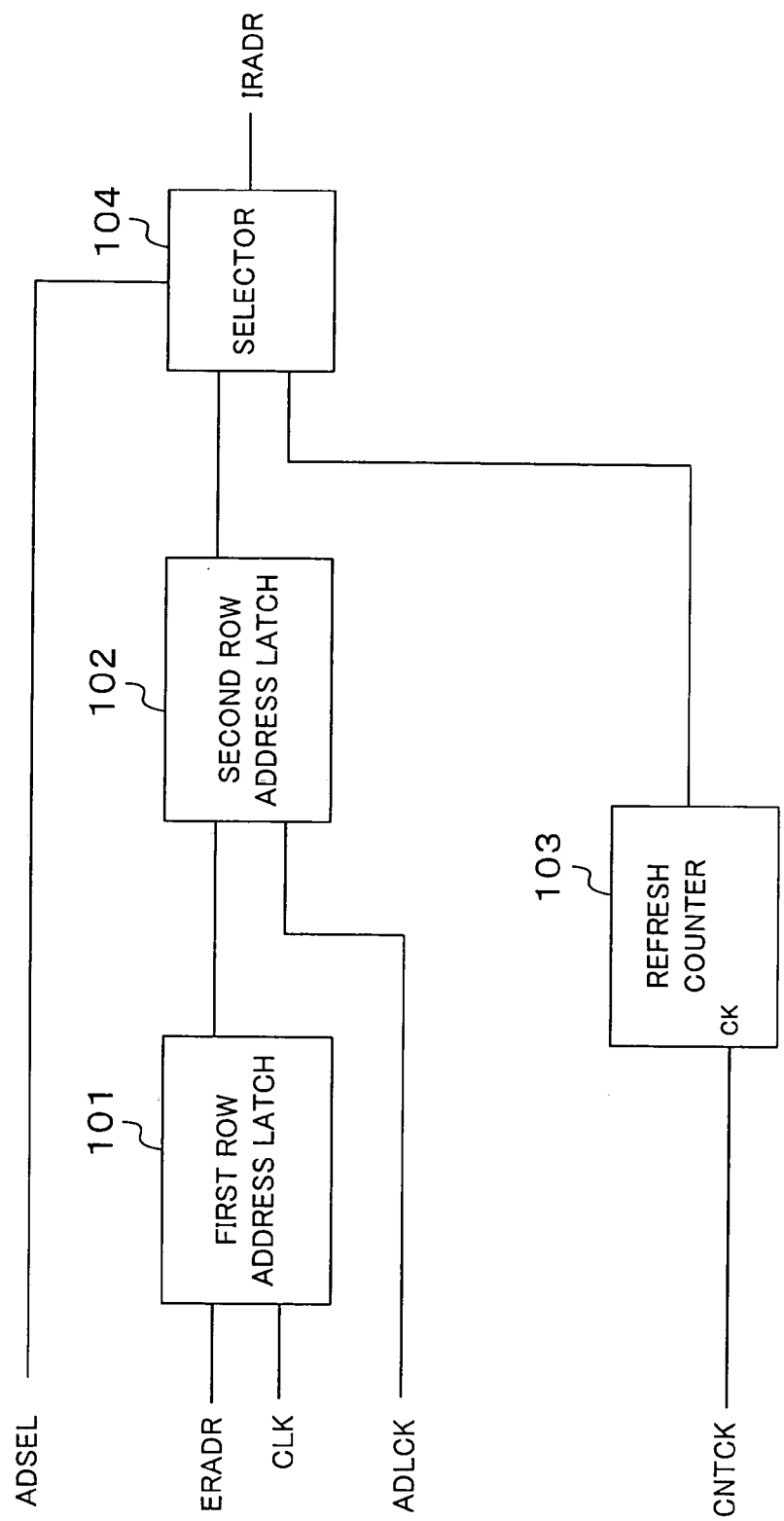
FIG. 4 is an internal circuit diagram of a row address generation unit included in the semiconductor device.
Figure 8:
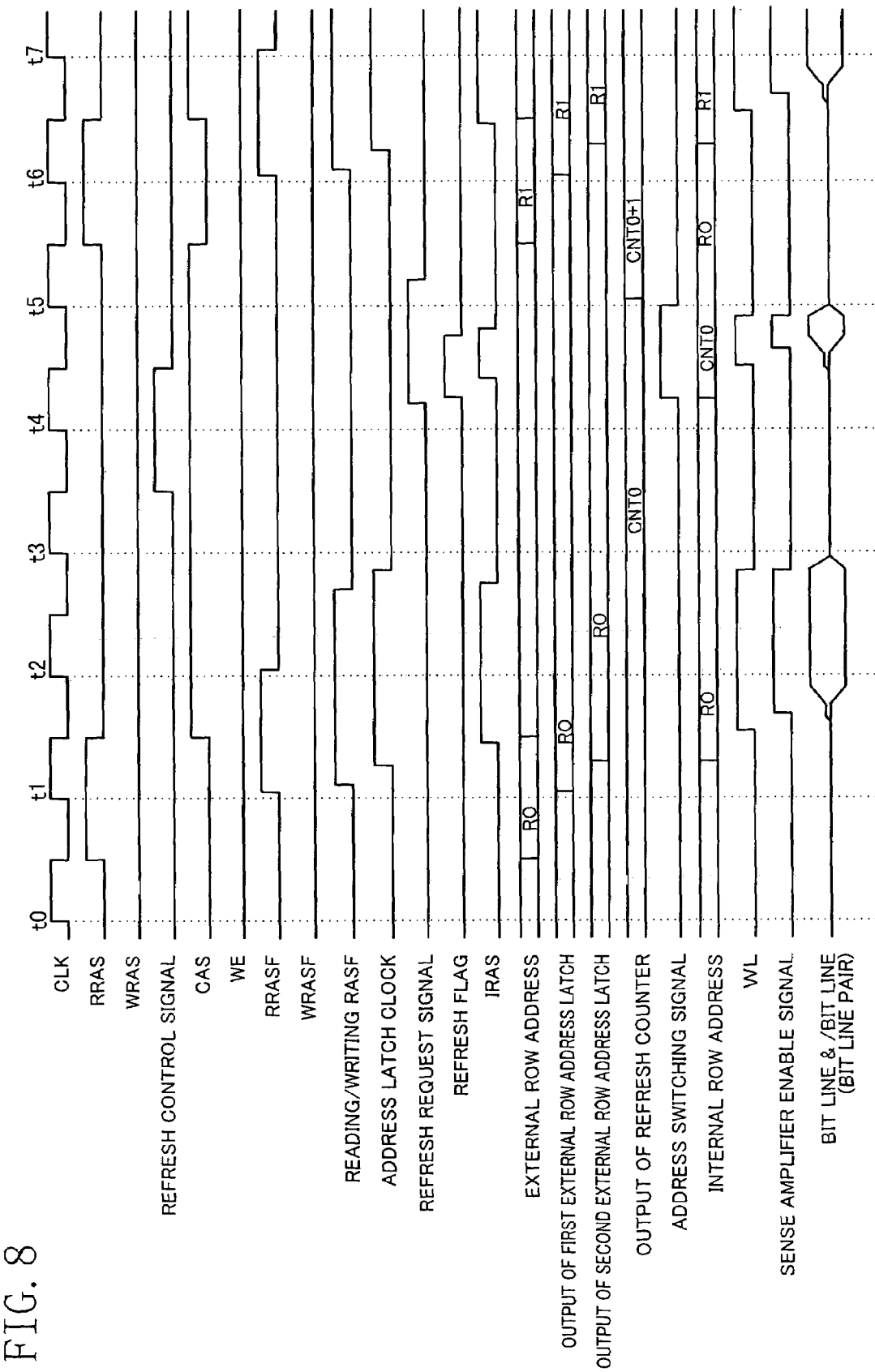
FIG. 8 is a timing chart for a page-mode read operation of a row control system of the semiconductor device.

In FIG. 8, since the reading row control signal RRSA is at H level in a time t1, in the row address generation unit 100 of FIG. 4, an external row address R0 is latched by a first external row address latch 101 at a rise of the clock signal, and then, after a delay time of a delay circuit 206 of the row control signal generation unit 200 of FIG. 3, namely, a delay time taken until complete of the bit line precharge of a previous cycle, an address latch clock rises. Therefore, the output of the first external row address latch 101 is latched by a second external row address latch 102 of FIG. 4 and selected by a selector 104, so as to be output as an internal row address to the row address pre-decoder 700 of FIG. 1. Thereafter, after delaying a given time necessary for pre-decoding the internal row address by a delay circuit 207 of the row control signal generation unit (row control circuit) 200 of FIG. 3, the internal row control signal IRAS is activated so as to start the row system operation. Accordingly, since the output of an internal row address for a next cycle is waited until the complete of the bit line precharge of a previous cycle, even when the processing of the previous cycle extends over the beginning of the next clock cycle, the internal row address is not changed during the processing of the previous cycle. Thus, an error operation can be effectively prevented.

In a time t3, when the refresh control signal undergoes a H transition at a rise of the clock signal, after a delay time of the delay circuit 214 of FIG. 3 from the rise of the clock signal, namely, after a time taken until the complete of the bit line precharge of the previous cycle, a set/reset circuit 219 of FIG. 3 is set, so as to activate the address switching signal. Thus, in the row address generation unit 100 of FIG. 4, the selector 104 is switched to the side of the refresh counter 103, and hence, the output (=CNT0) of the refresh counter 103 is output as the internal row address to the row address pre-decoder 700 of FIG. 1. Thereafter, after delaying a time necessary for pre-decoding the internal row address by the delay circuit 216 of the row control signal generation unit 200 of FIG. 3, the internal row control signal IRAS is activated so as to start the refresh operation. Accordingly, since the internal row address for the refresh operation is not allowed to be output until the bit line precharge of the previous cycle is completed, the end portion of the previous cycle can be performed even during the auto refresh cycle. After activating the internal row control signal IRAS, when a delay time of the delay circuit 221 of FIG. 3 elapses, the DFF 215 is reset so as to deactivate the internal row control signal IRAS. Thus, the refresh operation is completed within one clock signal cycle.

Figure 10:
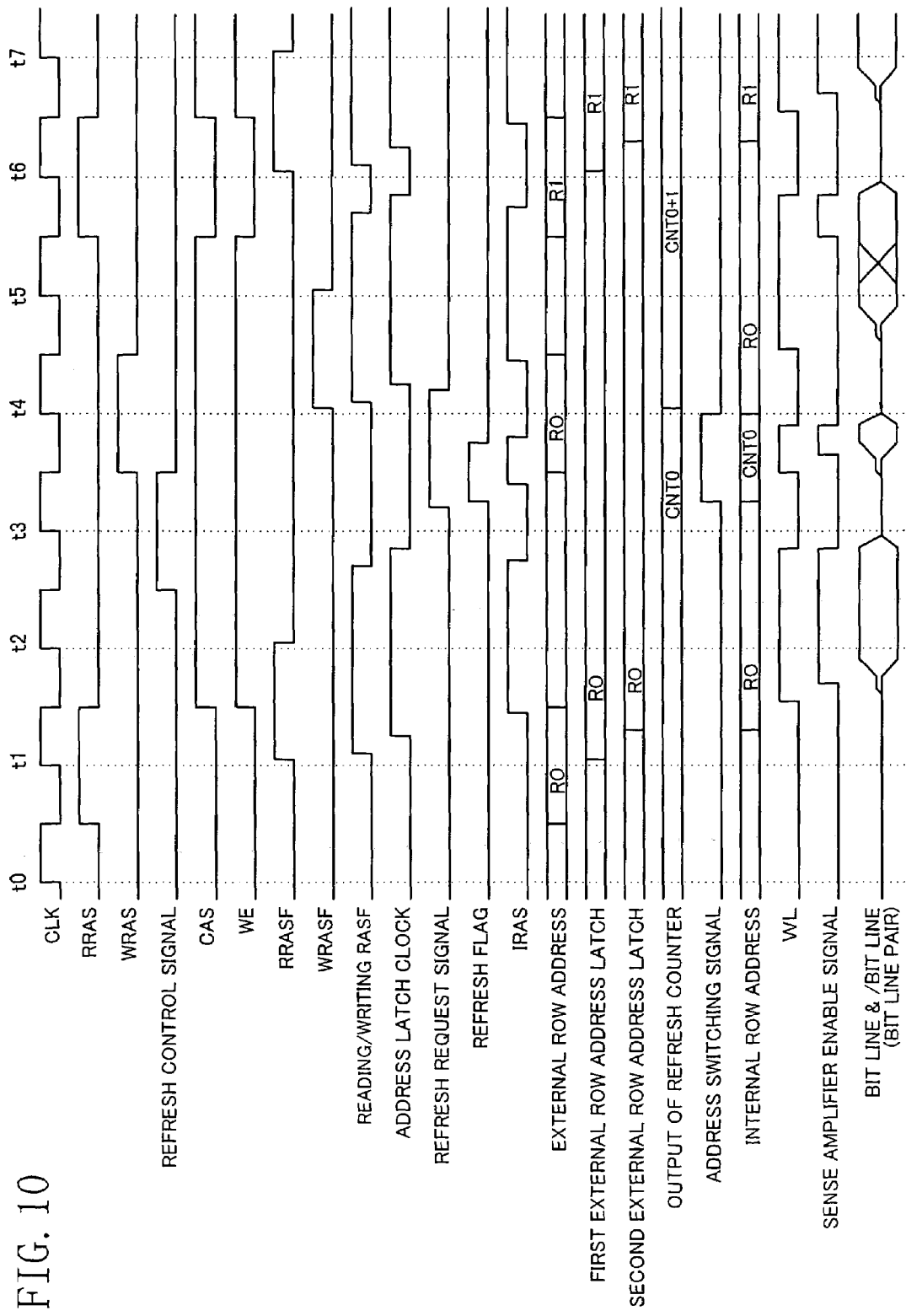
FIG. 10 is a timing chart for a page-mode write operation of the row control system of the semiconductor device.

FIG. 10 shows row control timing for the page-mode write operation. In FIG. 10, processing performed in a time t1 and a time t3 is the same as that performed in FIG. 8. When the writing row control signal WRAS undergoes a H transition in the time t1, an external row address is latched at the same timing as in the time t1, and the internal row control signal IRAS is activated. After completing the refresh operation of a previous cycle, the row system operation is started.

Figure 11:
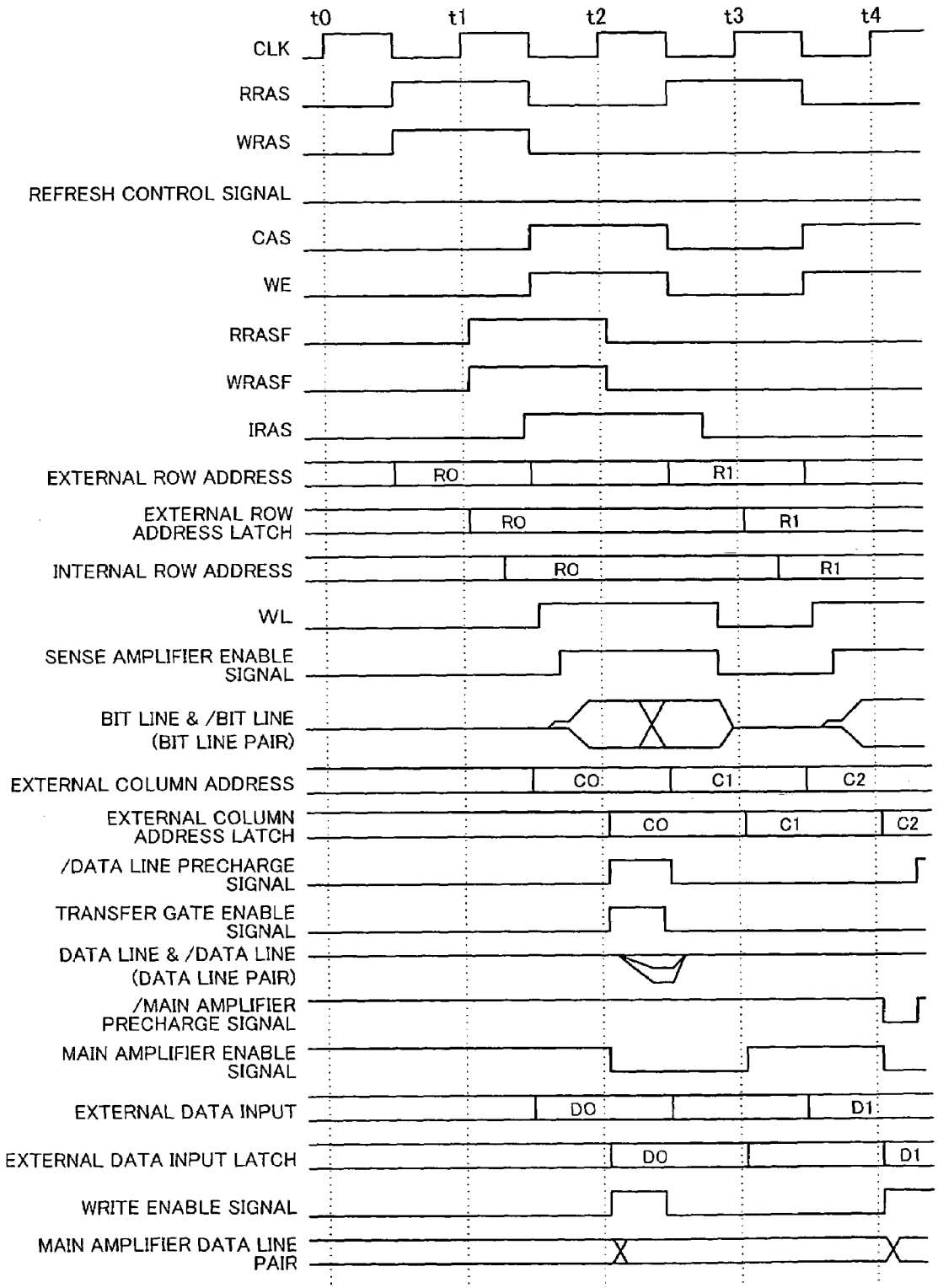
FIG. 11 is a timing chart for a random write operation of the semiconductor device.
Figure 12:
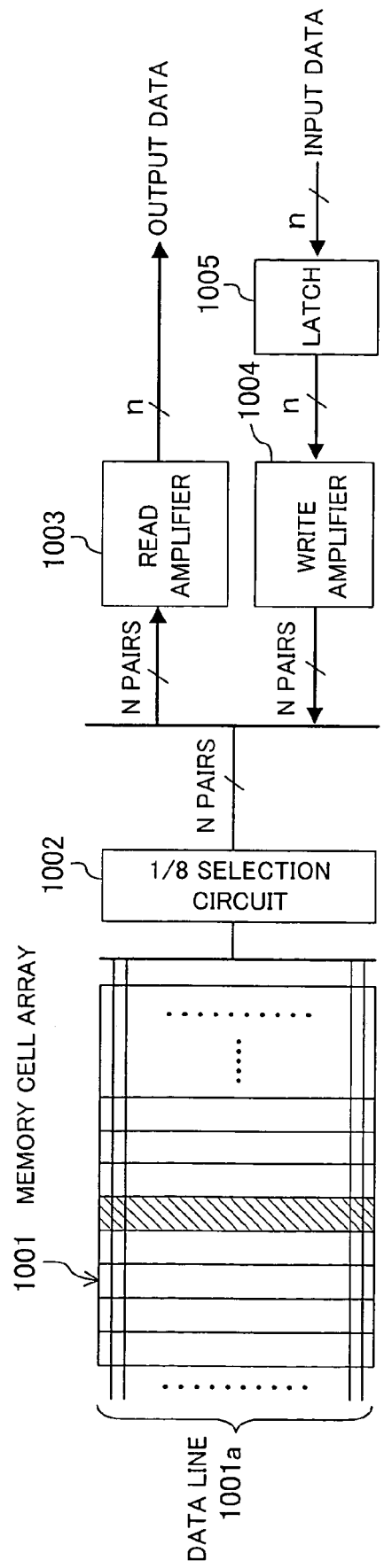
FIG. 12 is a schematic block diagram for showing the whole architecture of a conventional semiconductor device.
Figure 13:
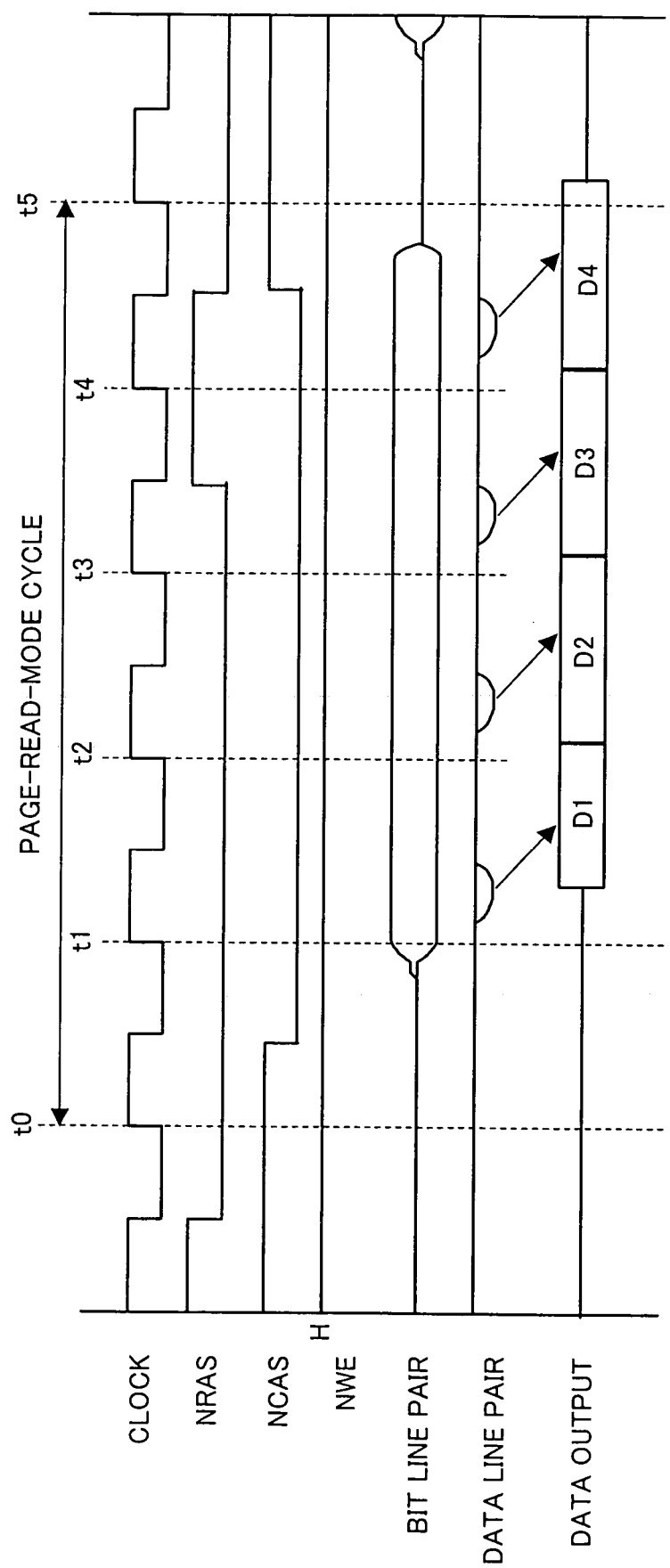
FIG. 13 is a timing chart for a page-mode read operation of the conventional semiconductor device.
Figure 14:
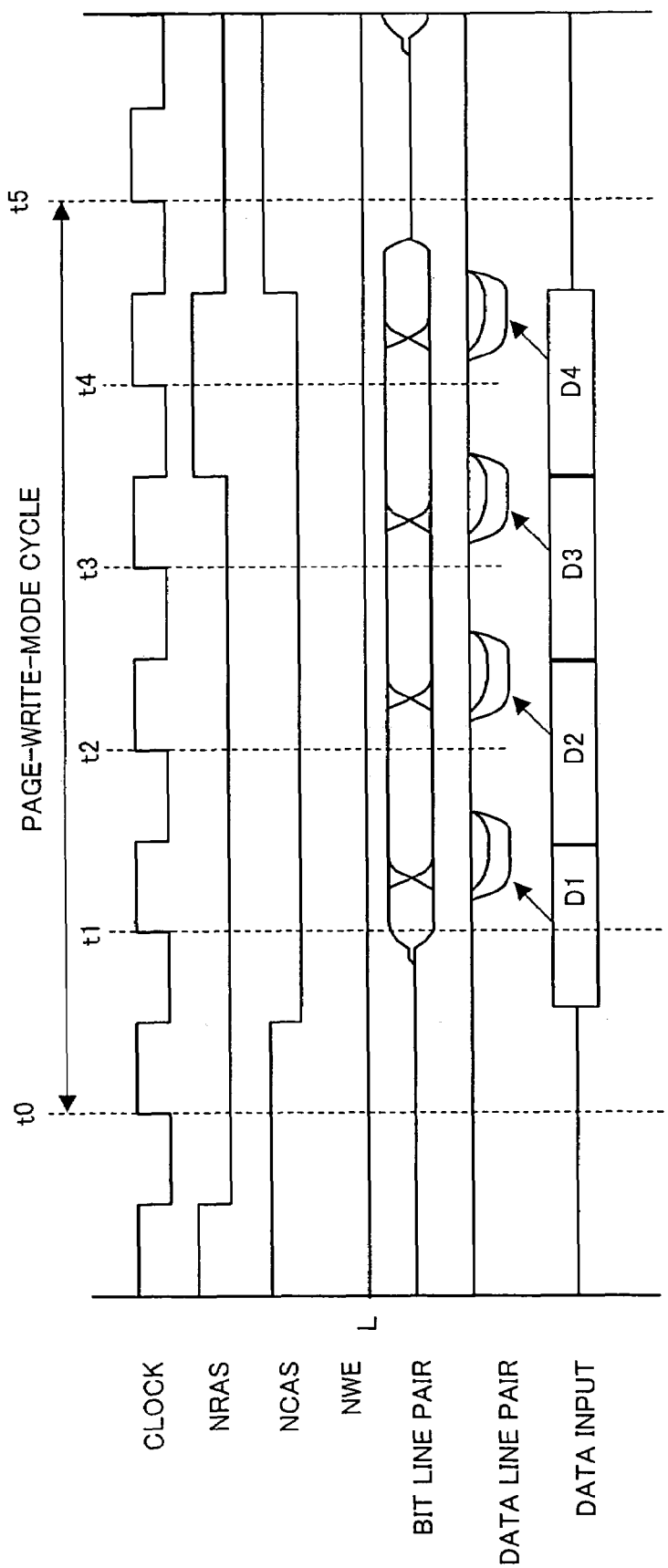
FIG. 14 is a timing chart for a page-mode write operation of the conventional semiconductor device.

Next, random write timing for the DRAM 900 of this embodiment is shown in FIG. 11. The random write timing will now be described.

In FIG. 11, when the reading row control signal RRAS and the writing row control signal WRAS undergo a H transition at a rise of the clock signal in a time t1, the reading row control signal flag RRASF supplied from the DFF 201 of the row control signal generation unit 200 of FIG. 3 is activated, the writing row control signal flag WRASF supplied from the DFF 202 is activated, and the internal row control signal (row activation/halt signal) IRAS is activated, so as to start the row system operation. When the internal row control signal IRAS is activated, the row decoder 750 receives the row pre-decode signal from the row address pre-decoder 700, and selects and turns on the word line WL in response to an external row address. Therefore, data of the memory cells MC connected to the word line WL through the transistors t is output to the bit lines BL and /BL. Also, the sense amplifier enable signal is activated through the AND circuits 417 and 419 of the second column control signal generation unit 400 of FIG. 6 so as to enable the sense amplifiers SA, and the data output to the bit lines BL and /BL is amplified.

In a time t2, since the reading row control signal flag RRASF is at H level, the writing row control signal flag WRASF is at H level, the column control signal CAS is at H level and the write enable signal WE is at H level at a rise of the clock signal, the /data line precharge signal R is activated through the DFF 302 of the column control signal generation unit 300 of FIG. 5 and the /data line precharge signal supplied from the OR circuit 902 of FIG. 1 is activated, so as to reset the precharge of the data lines DL and /DL. In addition, the transfer gate enable signal W is activated through the DFF 309 and the transfer gate enable signal supplied from the OR circuit 901 of FIG. 1 is activated, so as to turn on the connecting transistors TU, TL, CU and CL. Thus, input data latched by the input data latch 812 is written in the memory cells MC selected by the word line WL through the n selection switches SU selected in response to the external column address in accordance with the data selection signal (7:0) supplied from the column address decoder 600 and through the main amplifier data line pair MD, the data line pair DL and /DL and the bit line pair BL and /BL connected to the selected switches SU. At this point, the main amplifier enable signal is deactivated through a NAND circuit 320, a DFF 318 and the AND circuit 319 of the first column control signal generation unit 300 of FIG. 5 so as to halt the operations of the main amplifiers MA0 through MA(8n-1). Thus, data of the main amplifiers MA not selected in response to the external column address can be prevented from being written in the memory cells MC.

Thereafter, the transfer gate enable signal W is deactivated after a delay time of the delay circuit 405 of FIG. 6, and the connecting transistors TU, TL, CU and CL are turned OFF. Subsequently, after a delay time of the delay circuit 208 of FIG. 3 elapses, the DFF 204 is reset, and hence, the internal row control signal IRAS is deactivated, and the row decoder 750 turns off the word line WL, the operations of the sense amplifiers SA are halted, and the bit lines BL and /BL are precharged. Thus, the row system operation is stopped.

As described so far, according to the present invention, a refresh operation for memory cells can be performed even during a page-mode cycle, and therefore, the invention is effectively applicable to a semiconductor device, such as a DRAM, including memory cells that need a refresh operation for storing data.

What is claimed is:

1. A semiconductor device comprising:
a plurality of memory cells;
a plurality of bit line pairs respectively connected to said plurality of memory cells through transistors;
a plurality of sense amplifiers respectively connected to said plurality of bit line pairs;
a plurality of data line pairs respectively connected to said plurality of sense amplifiers;
a plurality of main amplifiers respectively connected to said plurality of data line pairs;
a plurality of switching circuits respectively provided between said plurality of sense amplifiers and said plurality of main amplifiers each for connecting/disconnecting a corresponding sense amplifier to/from a corresponding main amplifier; and
a memory control circuit,
wherein said memory control circuit controls said plurality of sense amplifiers, said plurality of main amplifiers and said plurality of switching circuits in such a manner as to:
receive a reading row control signal, a write enable signal, a clock signal, a row address and a column address;
data read from memory cells selected in response to said row address into corresponding main amplifiers through said bit line pairs, said sense amplifiers and said data line pairs in accordance with said clock signal when said reading row control signal is at active level;
disconnect said plurality of sense amplifiers from said plurality of main amplifiers by opening said plurality of switching circuits after said data read from said memory cells into said main amplifiers, and precharge said plurality of bit line pairs with said data held in said plurality of main amplifiers; and
output data held in said main amplifiers selected in response to said column address in accordance with said clock signal when said write enable signal is at non-active level.

2. A semiconductor device comprising:
a plurality of memory cells;
a plurality of bit line pairs respectively connected to said plurality of memory cells through transistors;
a plurality of sense amplifiers respectively connected to said plurality of bit line pairs;
a plurality of data line pairs respectively connected to said plurality of sense amplifiers;
a plurality of main amplifiers respectively connected to said plurality of data line pairs;
a plurality of switching circuits respectively provided between said plurality of sense amplifiers and said plurality of main amplifiers each for connecting/disconnecting a corresponding sense amplifier to/from a corresponding main amplifier; and
a memory control circuit,
wherein said memory control circuit performs processing of:
receiving a reading row control signal, a writing row control signal, a write enable signal, a clock signal, a row address and a column address;
data read from memory cells selected in response to said row address into corresponding main amplifiers through said bit line pairs, said sense amplifiers and said data line pairs in accordance with said clock signal when said reading row control signal is at active level;
when said write enable signal is at active level, externally supplied input data into main amplifiers selected in response to said column address, disconnecting said plurality of sense amplifiers from said plurality of main amplifiers by opening said plurality of switching circuits, and precharging said plurality of bit line pairs with said sense amplifiers disconnected from said main amplifiers; and
writing data held in said main amplifiers into memory cells selected in response to said row address through said sense amplifiers in accordance with said clock signal when said writing row control signal is at active level.

3. A semiconductor device comprising:
a plurality of memory cells;
a plurality of bit line pairs respectively connected to said plurality of memory cells through transistors;
a plurality of sense amplifiers respectively connected to said plurality of bit line pairs;
a plurality of data line pairs respectively connected to said plurality of sense amplifiers;
a plurality of main amplifiers respectively connected to said plurality of data line pairs;
a plurality of switching circuits respectively provided between said plurality of sense amplifiers and said plurality of main amplifiers each for connecting/disconnecting a corresponding sense amplifier to/from a corresponding main amplifier; and
a memory control circuit,
wherein said memory control circuit controls said plurality of sense amplifiers, said plurality of main amplifiers and said plurality of switching circuits in such a manner as to:
receive a reading row control signal, a write enable signal, a writing row control signal, a clock signal, a row address and a column address;
data read from memory cells selected in response to said row address into corresponding main amplifiers through said bit line pairs, said sense amplifiers and said data line pairs in accordance with said clock signal when said reading row control signal is at active level;
disconnect said plurality of sense amplifiers from said plurality of main amplifiers by opening said plurality of switching circuits after said data read from said memory cells into said main amplifiers, and precharge said plurality of bit line pairs with said data held in said plurality of main amplifiers;
output data held in said main amplifiers selected in response to said column address in accordance with said clock signal when said write enable signal is at non-active level;
when said write enable signal is at active level, externally supplied input data into main amplifiers selected in response to said column address, disconnect said plurality of sense amplifiers from said plurality of main amplifiers by opening said plurality of switching circuits, and precharge said plurality of bit line pairs with said sense amplifiers disconnected from said main amplifiers; and
write data held in said main amplifiers into memory cells selected in response to said row address through said plurality of sense amplifiers in accordance with said clock signal when said writing row control signal is at active level.

4. The semiconductor device of claim 1 or 3,
wherein said memory control circuit receives a column control signal, and outputs, when said write enable signal is at non-active level, data held in main amplifiers selected in response to said column address in accordance with said clock signal when said column control signal is at active level.

5. The semiconductor device of claim 2 or 3,
wherein said plurality of switching circuits are composed of connecting transistors disposed between said plurality of data line pairs and said plurality of main amplifiers, and
said memory control circuit controls said connecting transistors to be turned on for writing data held in said main amplifiers into said memory cells through said sense amplifiers in accordance with said clock signal when said writing row control signal is at active level, and controls said connecting transistors to be turned off in a time other than a time for writing said data.

6. The semiconductor device of claim 2 or 3,
wherein, when said write enable signal is activated subsequently after said reading row control signal is activated, said memory control circuit writes said externally supplied input data into said main amplifiers after writing said data read from said memory cells into said main amplifiers.

7. The semiconductor device of claim 2 or 3,
wherein said memory control circuit receives a column control signal, and writes, when said write enable signal is at active level, said externally supplied input data into said main amplifiers selected in response to said column address as far as said column control signal is at active level.

8. The semiconductor device of claim 2 or 3,
wherein said memory control circuit writes said data held in said main amplifiers into said memory cells through said sense amplifiers with amplifying operations of said sense amplifiers halted when said writing row control signal is at active level.

9. The semiconductor device of claim 2 or 3,
wherein said memory control circuit receives a column control signal, and writes, when said writing row control signal is at active level, said data held in said main amplifiers into said memory cells through said sense amplifiers when said column control signal is at active level.

10. The semiconductor device of claim 1, 2 or 3,
wherein, in a clock cycle following activation of said reading row control signal, said memory control circuit writes data read from said memory cells into said main amplifiers through said data line pairs after precharging said data line pairs.

11. The semiconductor device of claim 1, 2 or 3,
wherein said memory control circuit receives a column control signal, and writes data read from said memory cells selected in response to said row address into said main amplifies through said sense amplifiers when said column control signal is activated after activation of said reading row control signal.

12. The semiconductor device of claim 1, 2 or 3,
wherein said switching circuits are composed of connecting transistors disposed between said data line pairs and said main amplifiers, and
said memory control circuit controls said connecting transistors to be turned on at start of writing said data read from said memory cells into said main amplifiers when said reading row control signal is at active level, and controls said connecting transistors to be turned off when an amplitude difference between each data line pair attains a level that is able to be sense amplified by a corresponding main amplifier.

13. The semiconductor device of claim 1, 2 or 3,
wherein said memory control circuit receives a refresh control signal, and starts a refresh operation for said memory cells in accordance with said clock signal when said refresh control signal is at active level and completes said refresh operation within one clock signal cycle.

14. A semiconductor device comprising:
a plurality of memory cells;
a plurality of bit line pairs respectively connected to said plurality of memory cells through transistors;
a plurality of sense amplifiers respectively connected to said plurality of bit line pairs;
a plurality of data line pairs respectively connected to said plurality of sense amplifiers;
a plurality of main amplifiers respectively connected to said plurality of data line pairs;
a plurality of switching circuits respectively provided between said plurality of sense amplifiers and said plurality of main amplifiers each for connecting/disconnecting a corresponding sense amplifier to/from a corresponding main amplifier; and
a memory control circuit,
wherein said memory control circuit performs processing of:
receiving a writing row control signal, a write enable signal, a clock signal, a row address and a column address;
when said write enable signal is at active level, externally supplied input data into main amplifiers selected in response to said column address, disconnecting said plurality of sense amplifiers from said plurality of main amplifiers by opening said plurality of switching circuits, and precharging said plurality of bit line pairs with said data held in said plurality of main amplifiers; and
writing data held in said main amplifiers into memory cells selected in response to said row address through said sense amplifiers in accordance with said clock signal when said writing row control signal is at active level.

15. A semiconductor device comprising:
a plurality of memory cells;
a plurality of bit line pairs respectively connected to said plurality of memory cells through transistors;
a plurality of sense amplifiers respectively connected to said plurality of bit line pairs;
a plurality of data line pairs respectively connected to said plurality of sense amplifiers;
a plurality of main amplifiers respectively connected to said plurality of data line pairs;
a plurality of switching circuits respectively provided between said plurality of sense amplifiers and said plurality of main amplifiers each for connecting/disconnecting a corresponding sense amplifier to/from a corresponding main amplifier; and
a memory control circuit,
wherein said memory control circuit performs processing of:
receiving a reading row control signal, a writing row control signal, a write enable signal, a clock signal, a row address and a column address;

data read from memory cells selected in response to said row address into corresponding main amplifiers through said bit line pairs, said sense amplifiers and said data line pairs in accordance with said clock signal when said reading row control signal is at active level;

disconnecting said plurality of sense amplifiers from said plurality of main amplifiers by opening said plurality of switching circuits after said data read from said memory cells into said main amplifiers, and precharging said plurality of bit line pairs each to identical potential with said data held in said plurality of main amplifiers; and writing data held in said main amplifiers in memory cells selected in response to said row address through said sense amplifiers in accordance with said clock signal when said writing row control signal is at active level.

16. The semiconductor device of claim 1, 2, 3, 14 or 15, further comprising:

a first row address latch for receiving said row address and said clock signal and latching said row address in accordance with said clock signal;

a second row address latch for latching an output of said first row address latch at timing delayed from said clock signal by a given time; and a row control circuit, wherein said row control circuit receives said clock signal and a row control signal, and outputs a row activation signal with a delay of a given time from a latch signal of said second row address latch when said row control signal is at active level at a rise or fall of said clock signal.

17. The semiconductor device of claim 16, wherein said row control circuit receives a refresh control signal and outputs said row activation signal with a delay of a given time from a rise or fall of said clock signal when said refresh control signal is at active level at a rise or fall of said clock signal, and said given time for the delay is set to a time exceeding a delay time from said latch signal of said second row address latch to output of said row activation signal.

18. The semiconductor device of claim 2 or 3, wherein said memory control circuit writes said externally supplied input data directly into memory cells selected in response to said row address and said column address when said reading row control signal and said writing row control signal are both at active level at a rise or fall of said clock signal.

19. The semiconductor device of claim 18, wherein said memory control circuit halts amplifying operations of said main amplifiers when said externally supplied input data is directly written in said memory cells.

20. The semiconductor device of claim 2 or 3, wherein said memory control circuit writes said data held in said main amplifiers through said bit line pairs immediately after a rise or fall of said clock signal when said writing row control signal is at active level at a rise or fall of said clock signal.

* * * * *